(12) United States Patent
Liao et al.

(10) Patent No.: US 11,852,983 B2
(45) Date of Patent: Dec. 26, 2023

(54) COATER PHOTORESIST ARM SMART CENTERING JIG

(71) Applicant: Taiwan Semiconductor Manufacturing Company, Ltd., Hsinchu (TW)

(72) Inventors: Heng-Wei Liao, Taichung (TW); Ju-Hung Chen, Hsinchu County (TW); Shih-Yun Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 103 days.

(21) Appl. No.: 17/400,483

(22) Filed: Aug. 12, 2021

(65) Prior Publication Data

US 2023/0046778 A1 Feb. 16, 2023

(51) Int. Cl.
| | |
|---|---|
| *G03F 7/20* | (2006.01) |
| *G03F 7/16* | (2006.01) |
| *H01L 21/68* | (2006.01) |
| *H01L 21/67* | (2006.01) |
| *G03F 7/00* | (2006.01) |

(52) U.S. Cl.
CPC ............ *G03F 7/7085* (2013.01); *G03F 7/162* (2013.01); *H01L 21/6715* (2013.01); *H01L 21/68* (2013.01)

(58) Field of Classification Search
CPC ....... G03F 7/162; G03F 7/7085; H01L 21/68; H01L 21/681; H01L 21/6838
See application file for complete search history.

(56) References Cited

U.S. PATENT DOCUMENTS

| | | | |
|---|---|---|---|
| 2015/0262848 A1* | 9/2015 | Sano | H01L 21/6715 156/345.17 |
| 2018/0053319 A1* | 2/2018 | Kakuma | H01L 21/67259 |
| 2022/0199448 A1* | 6/2022 | Takahashi | H01L 21/67144 |

* cited by examiner

*Primary Examiner* — James M Mellott
(74) *Attorney, Agent, or Firm* — Lippes Mathias LLP

(57) ABSTRACT

An alignment nozzle jig for centering a coater photoresist arm that includes an alignment nozzle block. The alignment nozzle jig also includes an endoscope holder removably secured to a bottom of the alignment nozzle block, an endoscope, and an alignment mark removably coupled to the endoscope holder opposite the alignment nozzle block. The alignment nozzle jig is retrieved from a nozzle bath by the coater arm and transferred to a center of a chuck in an associated process chamber. Via the endoscope, the coater photoresist arm is aligned with the center of the chuck using the alignment mark.

20 Claims, 24 Drawing Sheets

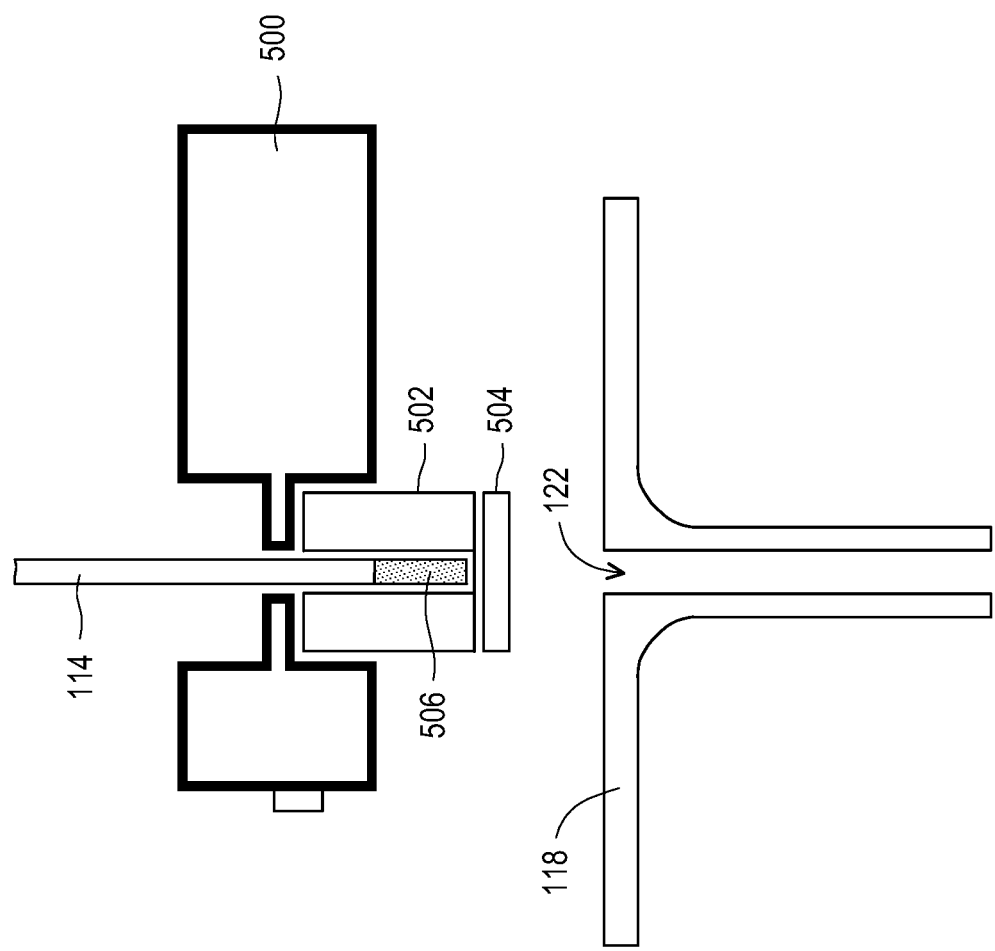

COATER PHOTORESIST ARM SMART CENTERING JIG

BACKGROUND

The following relates to photolithography, semiconductor fabrication, and application of photoresist materials. Photoresist (PR) is a crucial element in the semiconductor industry, and is used during various stages of the semiconductor fabrication process for forming patterns on wafers. As the process of photolithography in wafer production matures, the amount of photoresist used is reduced. As a result of the reduction in the amount of photoresist used, the size of the photoresist nozzle tip that applies the photoresist onto the wafer is also reduced in size. The precision of placement of the photoresist becomes greater, and therefore centering of the photoresist nozzle tip rises in importance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 6 is a cross-sectional view of an alignment nozzle jig in accordance with one embodiment of the subject application.

DETAILED DESCRIPTION

Figure 1:
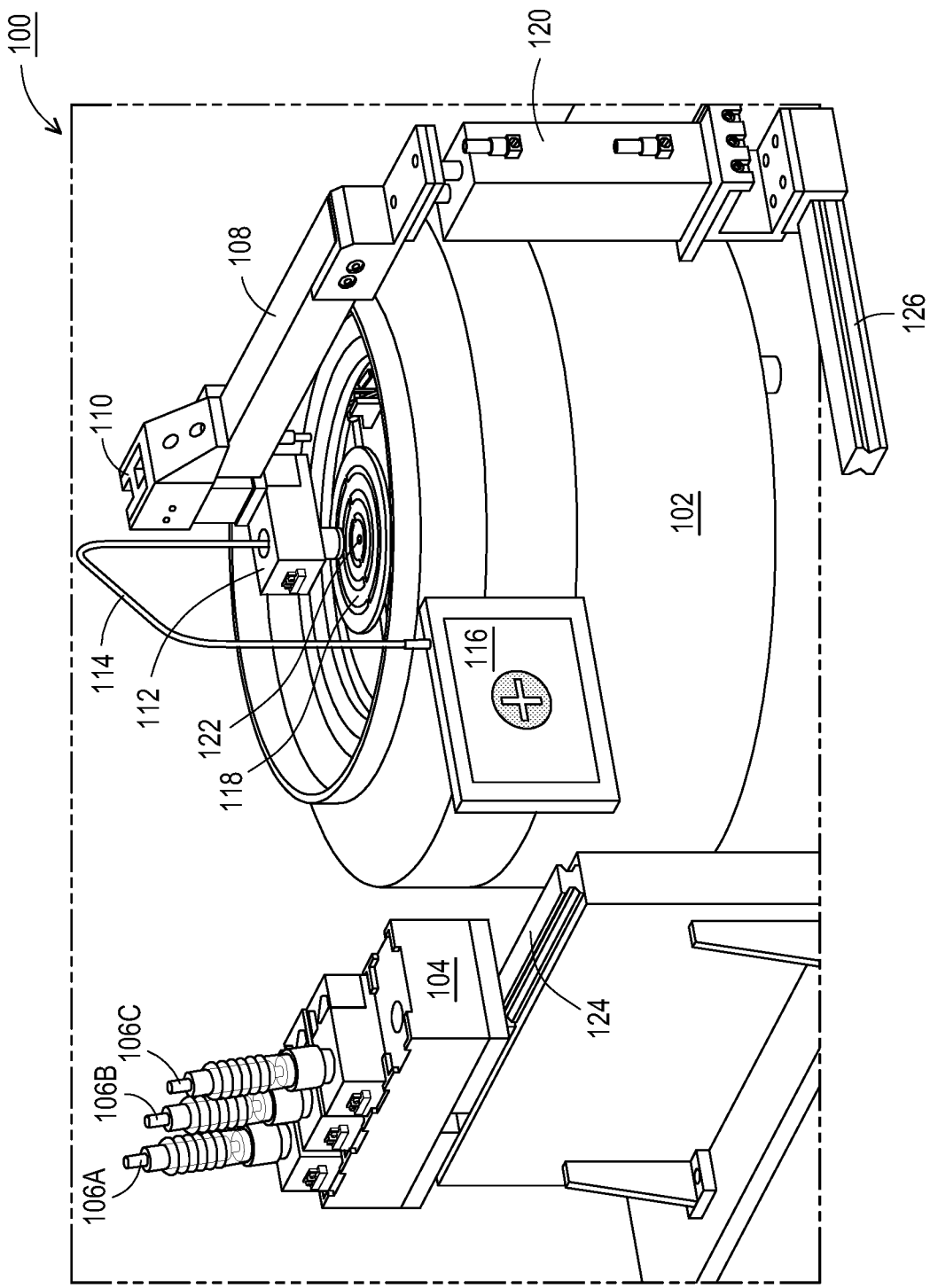
FIG. 1 is an illustration of a semiconductor fabrication system utilizing an alignment nozzle jig in accordance with one embodiment of the subject application.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Numerical values in the specification and claims of this application should be understood to include numerical values which are the same when reduced to the same number of significant figures and numerical values which differ from the stated value by less than the experimental error of conventional measurement technique of the type described in the present application to determine the value. All ranges disclosed herein are inclusive of the recited endpoint.

The term "about" can be used to include any numerical value that can vary without changing the basic function of that value. When used with a range, "about" also discloses the range defined by the absolute values of the two endpoints, e.g. "about 2 to about 4" also discloses the range "from 2 to 4." The term "about" may refer to plus or minus 10% of the indicated number.

In the semiconductor industry, there is a trend toward higher device density. In order to achieve such higher density, smaller features are required. Such requirements frequently involve scaling down device geometries to achieve lower fabrication costs, higher device integration density, higher speeds, and better performance. Along with the advantages from geometry size reductions, improvements to semiconductor devices are being made.

The scaling down process entails high resolution photolithographic process. Photolithography process may include techniques pertinent to coating a photoresist layer on a wafer and exposing the wafer to an exposing source. Subsequent to operations of coating and exposing, developer material is applied on the photoresist layer and the wafer is spun to disperse the developer material over the wafer. Thus at least a portion of the photoresist layer, which can be an irradiated portion or a non-irradiated portion, is dissolved by e developer material and thereby removed in order to form a predetermined pattern.

Turning now to FIG. 1, there is shown a semiconductor fabrication system 100 utilizing an alignment nozzle jig or assembly 112 in accordance with one exemplary embodiment of the subject application. It will be appreciated by those skilled in the art that the semiconductor fabrication system 100 depicted in FIG. 1 is representative of one component of semiconductor fabrication, and in particular, application of photoresist on an associated wafer (not shown). The system 100 includes a process chamber 102, into which the associated wafer may be placed for further processing, e.g., photolithographic processing.

As illustrated in FIG. 1, a nozzle bath 104 is positioned in proximity to the process chamber 102. The nozzle bath 104, in accordance with one embodiment, is configured to hold one or more photoresist (PR) nozzle assemblies, illustrated in FIG. 1 as PR 1 nozzle assembly 106A, PR 2 nozzle assembly 106B, PR 3 nozzle assembly 106C, and PR 4 nozzle assembly 106D. The skilled artisan will appreciate that the nozzle bath 104 may store any number of PR nozzle assemblies, and the depiction of four PR nozzle assemblies 106A-D in FIG. 1 is intended for example purposes only. Accordingly, the nozzle bath 104 may be configured to store one, two, three, four, five, six, or more PR nozzle assemblies in accordance with the process chamber 102 requirements, e.g., the number of different photoresists that are capable of being applied in the process chamber 102 to an associated wafer. As shown in FIG. 1, the nozzle bath 104 may be configured to be removably mounted to and slide along a rail 124 to position a particular PR nozzle assembly 106A-D for retrieval or return by a coater arm 108, as discussed below. The nozzle bath 104 is described in greater detail below with respect to FIGS. 2A-2B. In varying embodiments, the movement and/or position of the nozzle bath 104 may be directed by a controller (not shown) associated with the process chamber 102, i.e., a suitable processor in communication with memory that stores instructions that are executed by the processor causing the processor to perform one or more actions/processes.

Figure 3A:
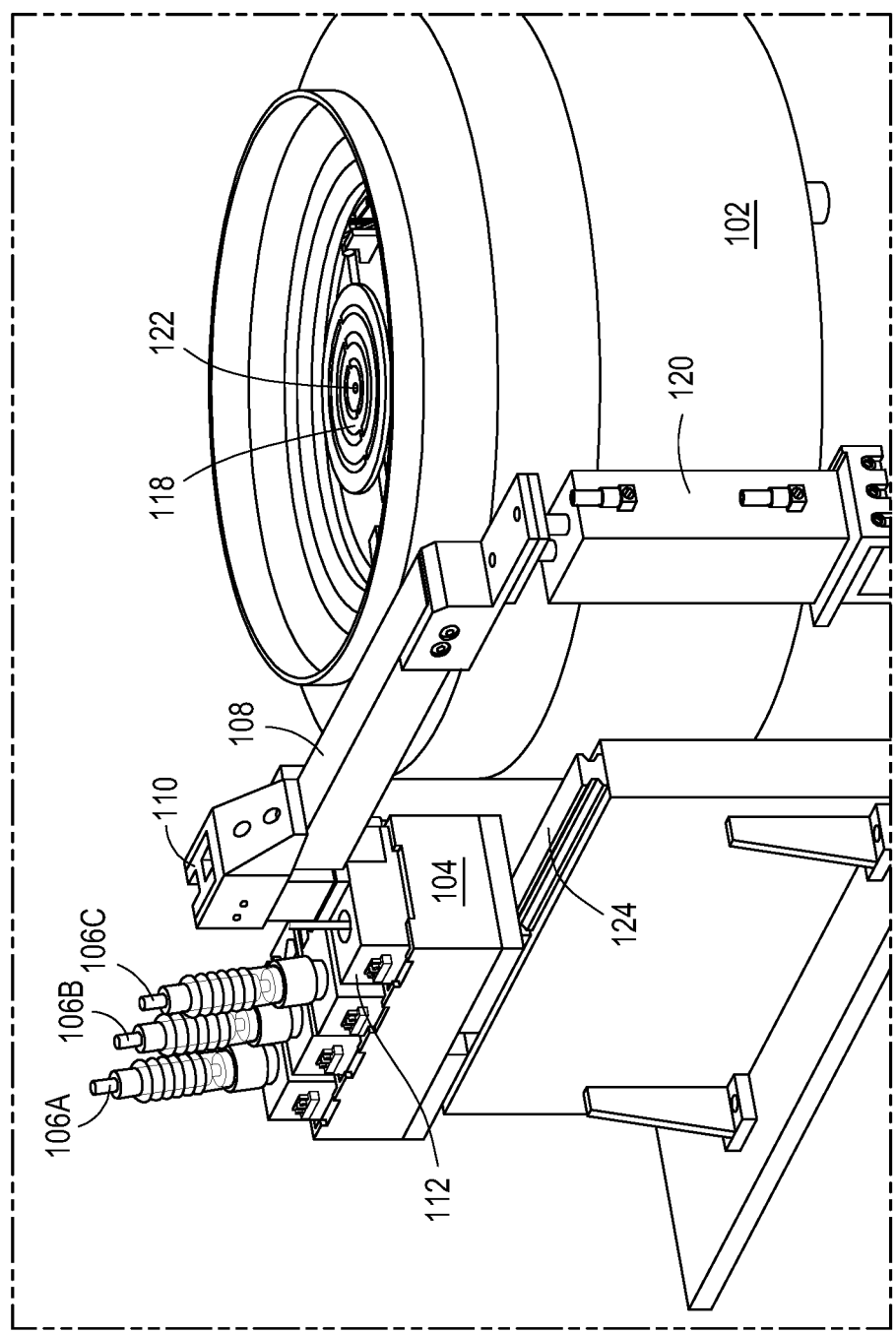
FIG. 3A is an illustration of a coater arm in a retrieval/return position in accordance with one embodiment of the subject application.
Figure 3B:
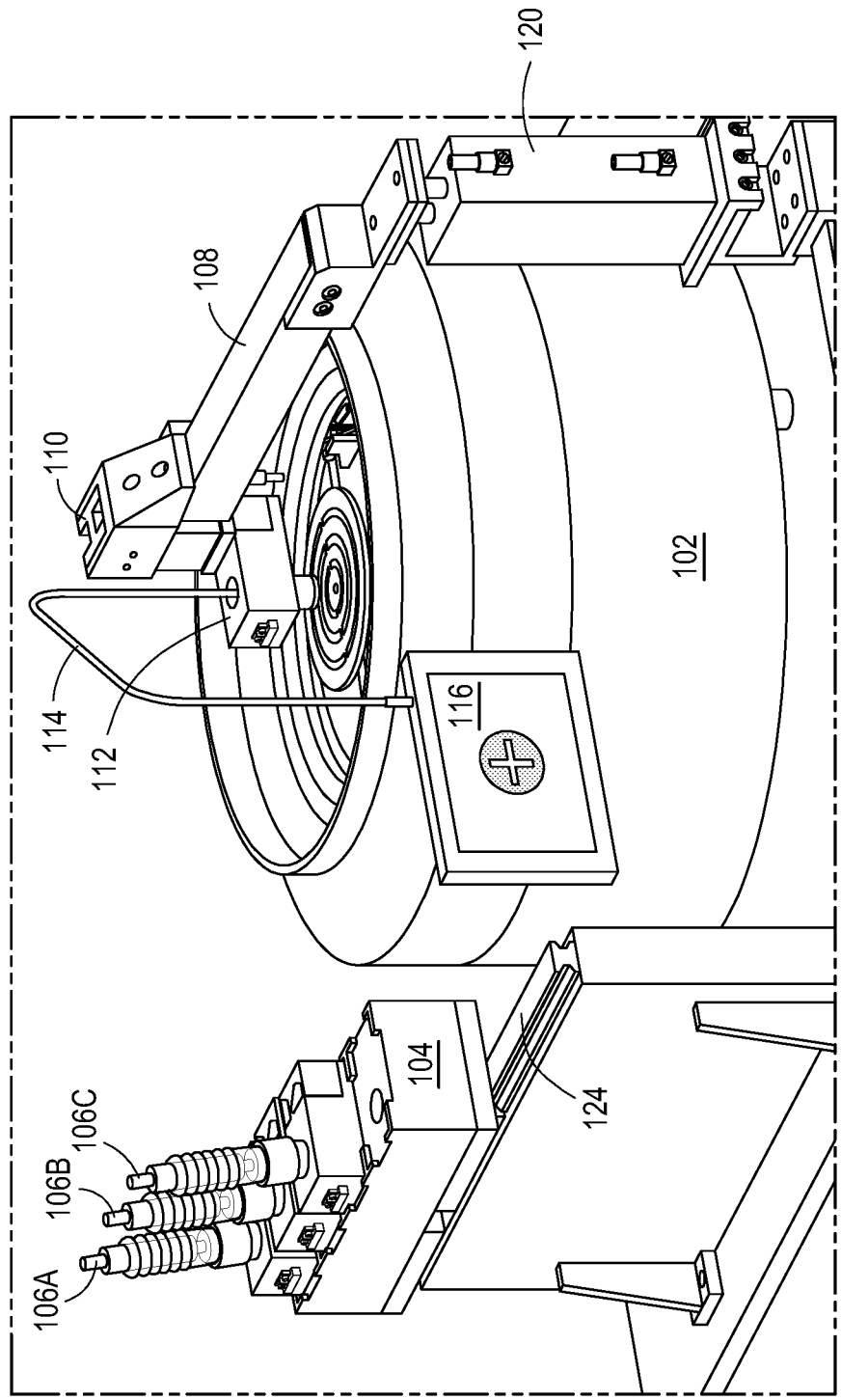
FIG. 3B is an illustration of a coater arm in a center position in accordance with one embodiment of the subject application.

The system 100 depicted in FIG. 1 further illustrates the coater arm 108 located adjacent the process chamber 108 and configured to move to and from the bath 104 during photoresist operations in accordance with one embodiment of the subject application. In some embodiments, the coater arm 108 includes a nozzle holder block lock cylinder 110 positioned at one end of the coater arm 108. The second end of the coater arm 108 is coupled to an up/down cylinder 120 positioned outside the process chamber 102, the up/down cylinder 120 configured to raise and lower the height of the coater arm 108 relative to the top of the process chamber 102. In varying embodiments contemplated herein, the up/down cylinder 120 is suitably mounted to a rail 126, enabling the coater arm 108 and up/down cylinder 120 to move along one axis to and from the process chamber 102 and the nozzle bath 104. FIGS. 3A-3B illustrate movement of the coater arm 108 and up/down cylinder 120 from in position at the nozzle bath 104 for PR nozzle assembly 106A-D or alignment block 112 retrieval/return (FIG. 3A) to positioning in front of the process chamber 102 for photoresist depositing (using PR nozzle assemblies 106A-D) or centering (using the nozzle alignment block 112) (FIG. 3B).

The nozzle holder block lock cylinder 110, according to one embodiment, is configured to hold on of the PR nozzle assemblies 106A-D during operations of the process chamber 102, i.e., when a photoresist is being applied to a wafer within the process chamber 102. In such an embodiment, the coater arm 108, via the nozzle holder block lock cylinder 110 is configured to retrieve and return the PR nozzle assemblies 106A-D to and from the nozzle bath 104 in accordance with the particular application of photoresist required by the process performed in the process chamber 102.

Positioned within the process chamber 102 of FIG. 1 is a chuck 118 configured to retain a wafer during operations of the process chamber 102. In varying embodiments, the chuck 118 may be implemented as a vacuum chuck having a chuck vacuum hole 122, whereupon vacuum is applied to a wafer placed on the chuck 118 to hold the wafer in position within the process chamber 102. Other embodiments contemplated herein may utilize alternative wafer retention mechanisms including, for example and without limitation, an electrostatic chuck. In some embodiments, the vacuum hole 122 is located at the center of the chuck 118 and is coupled to a tube to pump or other suitable mechanism for generating a vacuum through the tube to retain the associated wafer.

FIG. 1 further illustrates an alignment nozzle jig 112 utilized for centering the PR nozzle assemblies 106A-D when coupled to the coater arm 108 in accordance with one embodiment of the subject application. The alignment nozzle jig 112 is discussed in greater detail below with respect to FIGS. 5A-5B. The alignment nozzle jig 112 is coupled to an endoscope 114, which is attached to a view screen 116 in accordance with one embodiment of the subject application. The skilled artisan will appreciate that the endoscope 114, also known as a borescope, may correspond to any suitable optical instruction consisting of a rigid or flexible tube coupled to the view screen 116 at one end and having an objective lens (or camera) on the other end of the tube. In some embodiments, the endoscope 114 may include, for example and without limitation, an illumination component (e.g., fiberoptic illumination) to enhance brightness and contrast. It will be appreciated that various types of endoscopes/borescopes are capable of implementation in accordance with varying embodiments of the subject application. The view screen 116 may be any suitable viewing device including, for example and without limitation, an LCD display, an LED or OLED display, a CRT display, or the like. Additional components associated with the endoscope 114 included with the alignment nozzle jig 112 are discussed below with respect to FIGS. 5A5B.

Figure 2B:
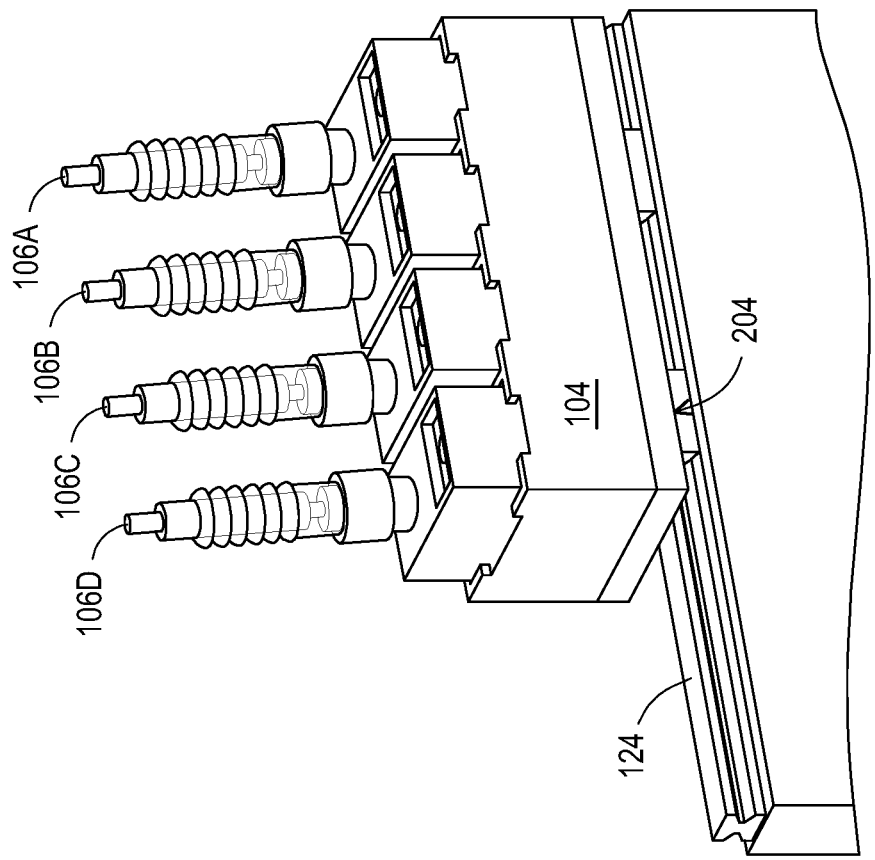
FIG. 2B is an illustration of a nozzle bath used by a semiconductor fabrication system in accordance with one embodiment of the subject application.
Figure 2A:
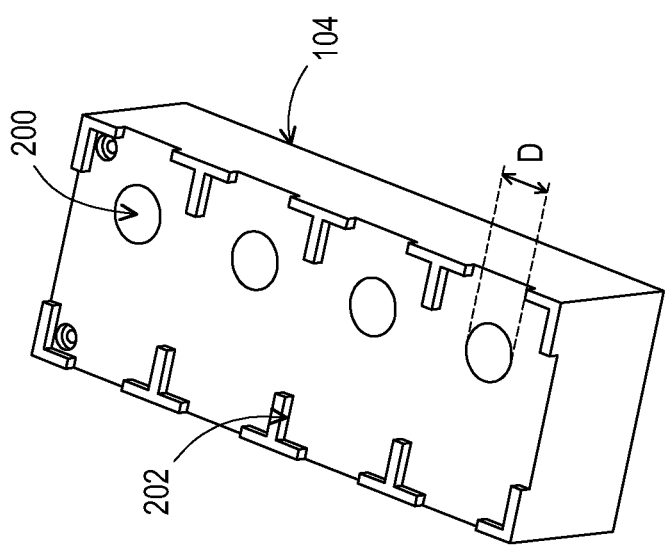
FIG. 2A is an illustration of an empty nozzle bath in accordance with one embodiment of the subject application.

Referring now to FIGS. 2A and 2B, there is an example nozzle bath 104 empty (FIG. 2A) and loaded (FIG. 2B) in accordance with one embodiment of the subject application. The nozzle bath 104 of FIG. 2A is depicted in an unloaded state, including a plurality of retaining holes 200 and position tabs 202. As shown, the retaining holes 200 are configured to receive the tip of a photoresist nozzle (shown in FIG. 4) of a PR nozzle assembly 106A-D, as well as an endoscope holder (shown in FIGS. 5A-5B) of a nozzle alignment block 112. The position tabs 202 are suitably configured to engage and retain a PR nozzle block (shown in FIG. 4) of a PR nozzle assembly 106A-D and an alignment block (shown in FIGS. 5A-5B) of the nozzle alignment assembly 112. In accordance with one embodiment, the position tabs 202 are implemented to engage slots on a bottom of a nozzle block to prevent movement thereof, and to ensure proper positioning for retrieval or return by the nozzle holder block lock cylinder 110 of the coater arm 108.

As discussed above, the size of the nozzle bath 104 may be adjusted in accordance with the number of PR nozzle assemblies 106A-D used by the process chamber 102 for photoresist application. In the nonlimiting example shown in FIGS. 1-2B, the number of PR nozzle assemblies 106A-D is four merely to provide one possible illustration, and the skilled artisan will appreciate that the number of PR nozzle assemblies 106A-D may vary, as well as the number of PR nozzle assemblies 106A-D capable of being supported in the nozzle bath 104. Accordingly, the nozzle bath 104 may have any number of positions to retain a corresponding number of PR nozzle assemblies 106A-D, such as, for example and without limitation, one, two, three, four, five, six, etc., with a corresponding number of retaining holes 200 and position tabs 202.

FIG. 2B depicts a close-up view of the nozzle bath 104 loaded with PR nozzle assemblies 106A-D in accordance with one embodiment of the subject application. It will be appreciated that the nozzle bath 104 may be loaded with the alignment nozzle jig 112 in place of one of the PR nozzle assemblies 106A-D, and the illustration in FIG. 2B is intended merely to provide an example of a loaded nozzle bath 104 in accordance with one embodiment of the subject application. As shown in FIG. 2B, the nozzle bath 104 is coupled to a trolley 204, positioned on a bottom of the nozzle bath 104, i.e., a side of the nozzle bath 104 opposite the location of the PR nozzle assemblies 106A-D and/or alignment nozzle jig 112. In varying embodiments contemplated herein, the trolley 204 is suitable configured to enable movement of the nozzle bath 104 along the rail 124 so as to position a PR nozzle assembly 106A-D and/or the alignment nozzle jig 112 for retrieval or return via the nozzle holder block lock cylinder 110 of the coater arm 108. In accordance with one embodiment, the trolley 204 includes one or more motors operative in response to a command and/or signal received from a controller or other suitable component associated with the system 100. In such an embodiment, the one or more motors enable movement along the rails via wheel, sprocket, screw drive, or other suitable mechanism for movement along the rail.

Figure 4:
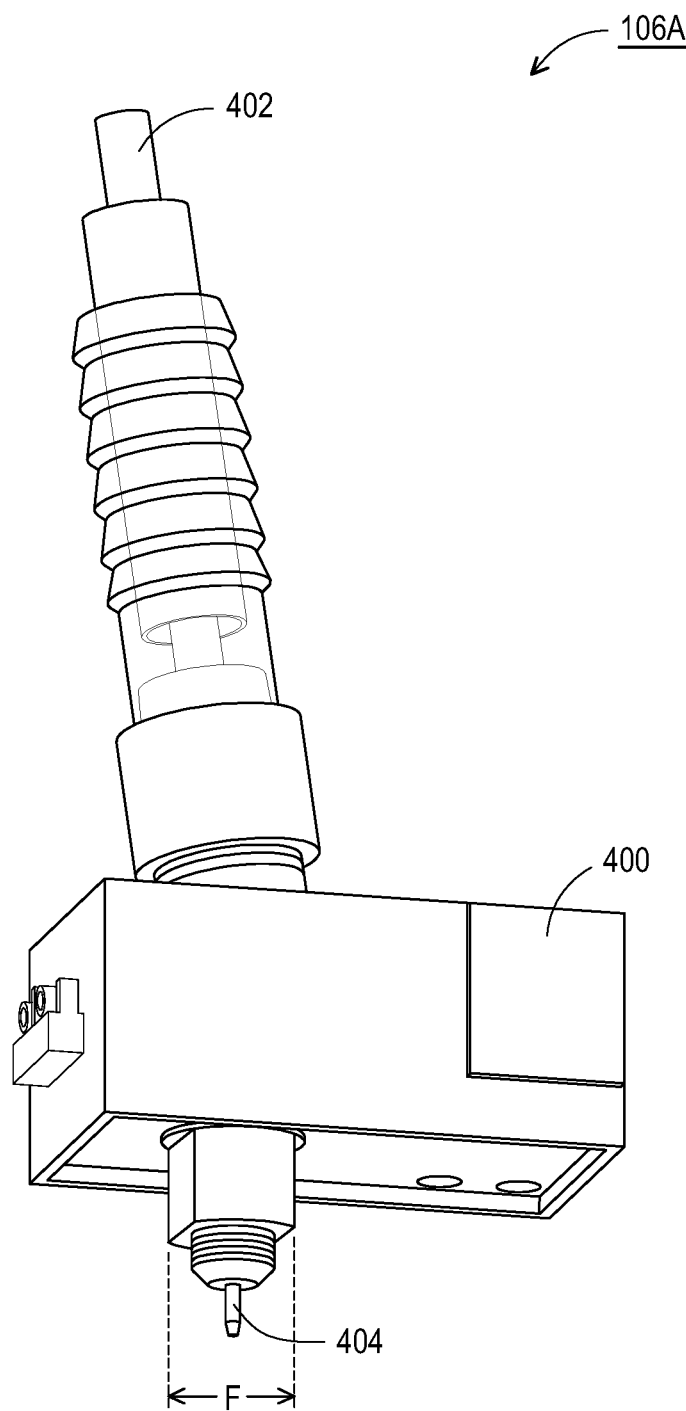
FIG. 4 is an illustration of a photoresist nozzle assembly in accordance with one embodiment of the subject application.

Turning now to FIG. 4, there is shown a detailed view of a PR nozzle assembly 106A-D in accordance with one embodiment of the subject application. It will be appreciated by those skilled in the art that the illustration in FIG. 4 is intended solely to provide an example of the various components of a PR nozzle assembly 106A-D, and various components may be added, removed, replaced, or altered in accordance with the type of process chamber 102 utilized in the system 100. The PR nozzle assembly 106A-D of FIG. 4 includes a nozzle holder block 400 suitably configured to be secured in the nozzle holder block lock cylinder 110 of the coater arm 108. As illustrated in FIG. 4, the nozzle holder block 400 is substantially rectangular in shape and is configured to rest on the nozzle bath 104 when not removably coupled to the nozzle holder block lock cylinder 110. In some embodiments, a bottom portion of the nozzle holder block 400 includes recesses configured to engage the position tabs 202 of the nozzle bath 104, as discussed above. A PR nozzle pipe 402 is positioned on a top portion of the nozzle holder block and extends through an opening (not shown) in the nozzle holder block 400, and passes through the nozzle holder block 400 to the bottom thereof. Coupled to the portion of the PR nozzle pipe 402 that extends out of the bottom of the nozzle holder block 400 is a nozzle tip 404. In accordance with some embodiments, the nozzle tip 404 may be configured to expel, release, or otherwise dispense photoresist during operations of the process chamber 102. In some embodiments, the PR nozzle pipe 402 may be coupled to a line, tube, reservoir, or the like, through or from which photoresist material is dispensed through the nozzle tip 404 by the PR nozzle pipe 402. According to varying embodiments contemplated therein, PR nozzle pipe 402 extending from the bottom of the nozzle holder block 400 has a diameter (D) less than or equal to the diameter (F) of the retaining holes 200 of the nozzle bath 104. In such embodiments, it will be appreciated that the depth of the retaining holes 200 of the nozzle bath 104 are greater than the distance from the bottom of the nozzle holder block 400 to the distal end of the nozzle tip 404, thereby preventing the nozzle tip 404 from contacting the bottom of the retaining hole 200 into which it is inserted.

Figure 5B:
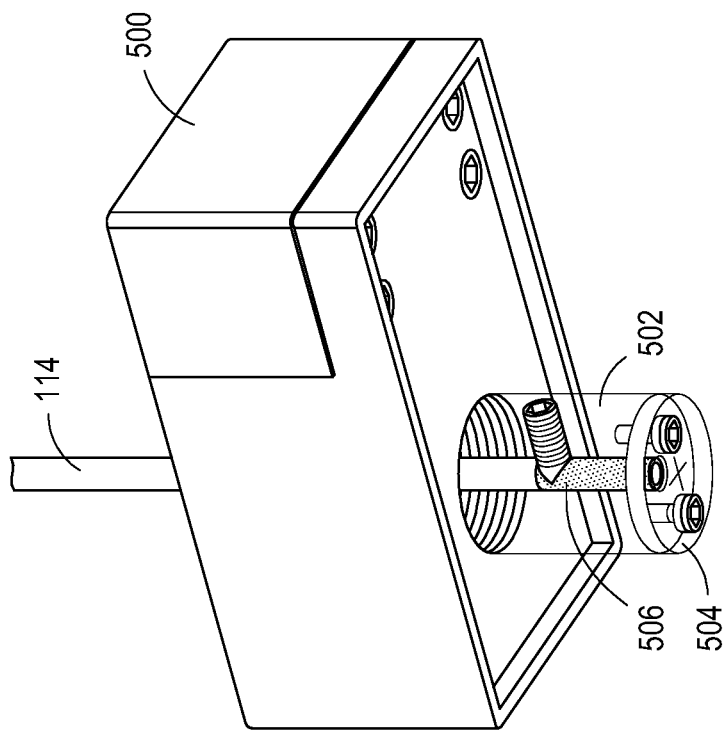
FIG. 5B is an illustration of the alignment nozzle jig of FIG. 5A according to one embodiment.
Figure 5A:
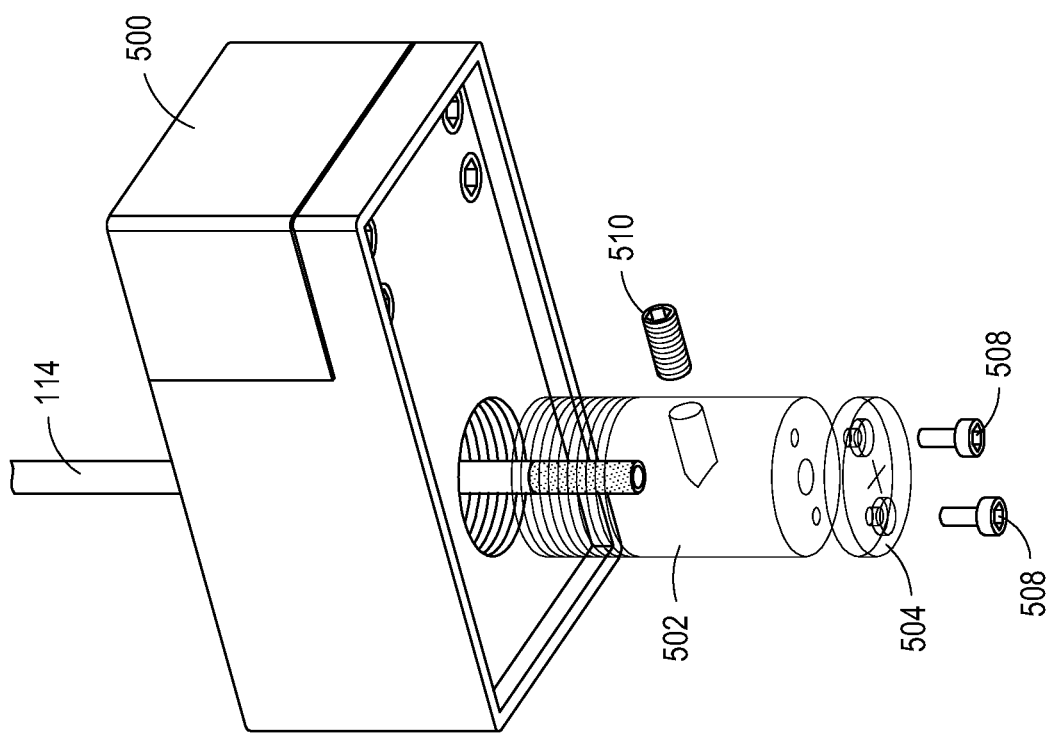
FIG. 5A is an exploded view of an alignment nozzle jig in accordance with one embodiment of the subject application.

FIGS. 5A-5B illustrate the alignment nozzle jig or assembly 112 according to one aspect of the subject application. FIG. 5A provides an exploded view of the alignment nozzle jig 112 in accordance with one embodiment of the subject application. As shown in FIG. 5A, the alignment nozzle jig/assembly 112 includes an alignment block 500 having the same or substantially similar dimensions as the nozzle holder block 400 of FIG. 4. In some embodiments, the alignment block 500 and the nozzle holder block 400 are identical. In other embodiments, the various components coupled to the nozzle holder block 400 (as set forth in FIG. 4) may be removed and the components described hereinafter with respect to FIGS. 5A-5B may be attached. As with the nozzle holder block 400 of FIG. 4, the alignment nozzle block 500 is suitably configured to engage the position tabs 202 of the nozzle bath 104 during retrieval and return of the block 500 to the bath 200. It will be understood that centering of the coater arm 108 in accordance with the methods set forth below, utilizes the positioning of the alignment holder block 500 not only while in the nozzle bath 104, but also when in position over the chuck 118 within the process chamber 102.

Removably coupled to the bottom of the alignment nozzle block 500 is an endoscope holder 502. As shown in FIG. 5A, the endoscope holder 502 may be threaded and engage corresponding threads of the alignment nozzle block 500, thereby securing the endoscope holder 502 to the block 500. Alternatively, set screws (not shown), friction retention (not shown), or other types of fasteners or fastening mechanisms may be utilized in accordance with varying embodiments of the subject application to removably secure the endoscope holder 502 to the bottom of the alignment nozzle block 500. In some embodiments, the endoscope holder 502 has an outer diameter substantially equal to the diameter (D) of the PR nozzle pipe 402 extending from the bottom of the nozzle holder block 400 of FIG. 4. The skilled artisan will appreciate that such substantially similar diameters enables secure storage of the alignment nozzle jig 112 in the nozzle bath 104 during centering operations of the coater arm 108 in accordance with varying embodiments of the subject application.

The endoscope holder 502 includes a lens 506 positioned to optically couple with the endoscope 114 extending therethrough. A set screw 510 is illustrated to secure the end of the endoscope 114 and the lens 506 within the endoscope holder 502 in accordance with one embodiment of the subject application. In another embodiment, the hole in which the set screw 510 is inserted is utilized for insertion of the endoscope 114 and the lens 506 is secured via adhesive, friction, threads, or the alignment mark 504. As shown in FIGS. 5A-5B, the alignment mark 504 is positioned on a bottom end of the endoscope holder 502 and secured thereto via one or more alignment mark screws 508. In other embodiments, the alignment mark 504 may be secured via adhesive, friction, or other suitable fastening mechanisms, as will be appreciated by those skilled in the art. The alignment mark 504 includes a marking 512 disposed thereon, which is utilized for centering of the coater arm 108, as set forth below.

FIG. 6 illustrates a side cutout view of the alignment nozzle jig 112 positioned within the process chamber 102 in accordance with one embodiment of the subject application. As shown in FIG. 6, the endoscope 114 transitions through the alignment nozzle block 500 from the top thereof to engage the endoscope holder 502 positioned on the bottom of the block 500. Secured within the endoscope holder 502 is the lens 506, which is interposed between the endoscope 114 and the alignment mark 504. FIG. 6 further provides an illustration of the alignment nozzle jig 112 positioned over the chuck 118 within the process chamber 102. Further, the cutout view of FIG. 6 illustrates the chuck vacuum hole 122 (vacuum line) in the center of the chuck 118, which is used for alignment of the coater arm 108 in accordance with the methods set forth below.

Figure 7:
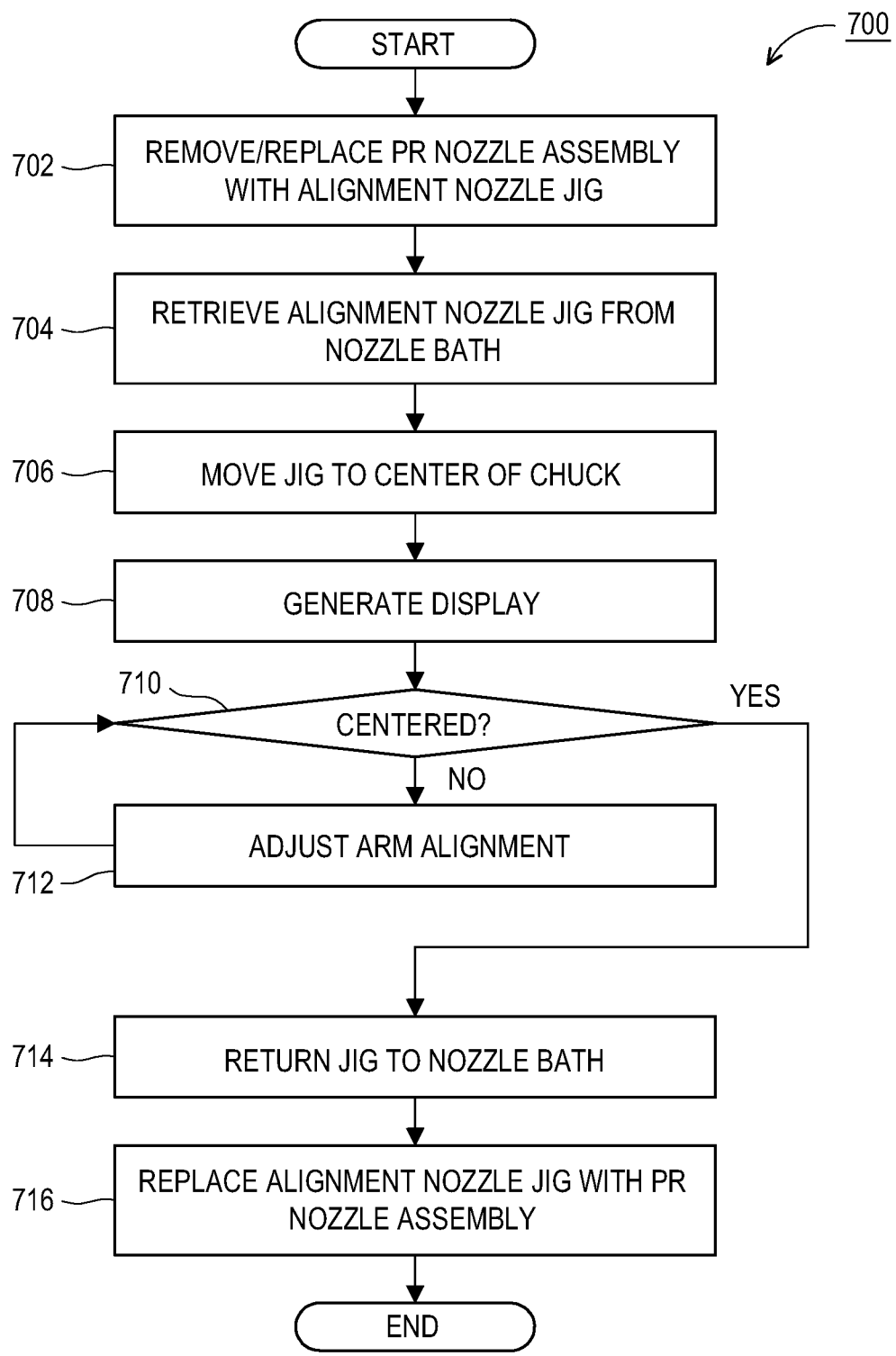
FIG. 7 is a flowchart illustrating a method for coater photoresist arm centering in accordance with one embodiment of the subject application.

Turning now to FIG. 7, there is shown a flowchart 700 for coater photoresist arm centering in accordance with one embodiment of the subject application. The method depicted in FIG. 7 begins at 702, whereupon a PR nozzle assembly 106A-D in the nozzle bath 104 is removed and replaced with the alignment nozzle jig 112. Replacement of the PR nozzle assembly 106A-D may be performed by a technician or user of the system 100 by manual removal of the PR nozzle assembly 106A-D from the nozzle bath 104 and manual insertion of the alignment nozzle jig 112 into the bath 104. In other embodiments, the skilled artisan will appreciate that automated mechanisms, such as robotic arms/grippers, magnetic grapple, or the like, may be utilized to remove the PR nozzle assembly 106A-D from the nozzle bath 104 and/or insert the alignment nozzle jig 112 into the bath 104. At 704, the coater arm 108 retrieves the alignment nozzle jig 112 from the nozzle bath 104. The coater arm 108, with the alignment nozzle jig 112 secured in the nozzle holder block lock cylinder 110 then moves, at 706, to the presumed center of the chuck 118 in the process chamber 102. It will be appreciated by those skilled in the art that is process may be operated automatically via a controller or other suitable electronic processing device. The view screen 116 then generates a display of an output of the endoscope 114 secured in the endoscope holder 502 of the alignment nozzle jig 112 at 708. In accordance with one embodiment of the subject application, the image depicted on the view screen 116 includes the alignment mark 504 and the vacuum hole 122.

A determination is then made at 710 whether the coater arm 108 is centered, i.e., whether the alignment mark 504 aligns with the vacuum hole 122. Upon a negative determination, flow proceeds to 712, whereupon adjustment of the coater arm 108 in at least one of the X axis position and/or Y axis position is made. After adjustment at 712, operations return to 710 for a determination as to whether the coater arm 108 is centered. If additional adjustments are required, operations return to 712 for adjustment. Upon a determination that no further adjustments are required, i.e., the alignment mark 504 and the vacuum hole 122 are aligned, operations proceed to 714, whereupon the coater arm 108 returns the alignment nozzle jig 112 to the nozzle bath 104. Thereafter, the alignment nozzle jig 112 is removed from the nozzle bath 104 and replaced with the previously removed (or a new) PR nozzle assembly 106A-D. The process chamber 102 is then enabled to perform photoresist applications on an associated wafer in the chamber 102 as needed.

Figure 8A:
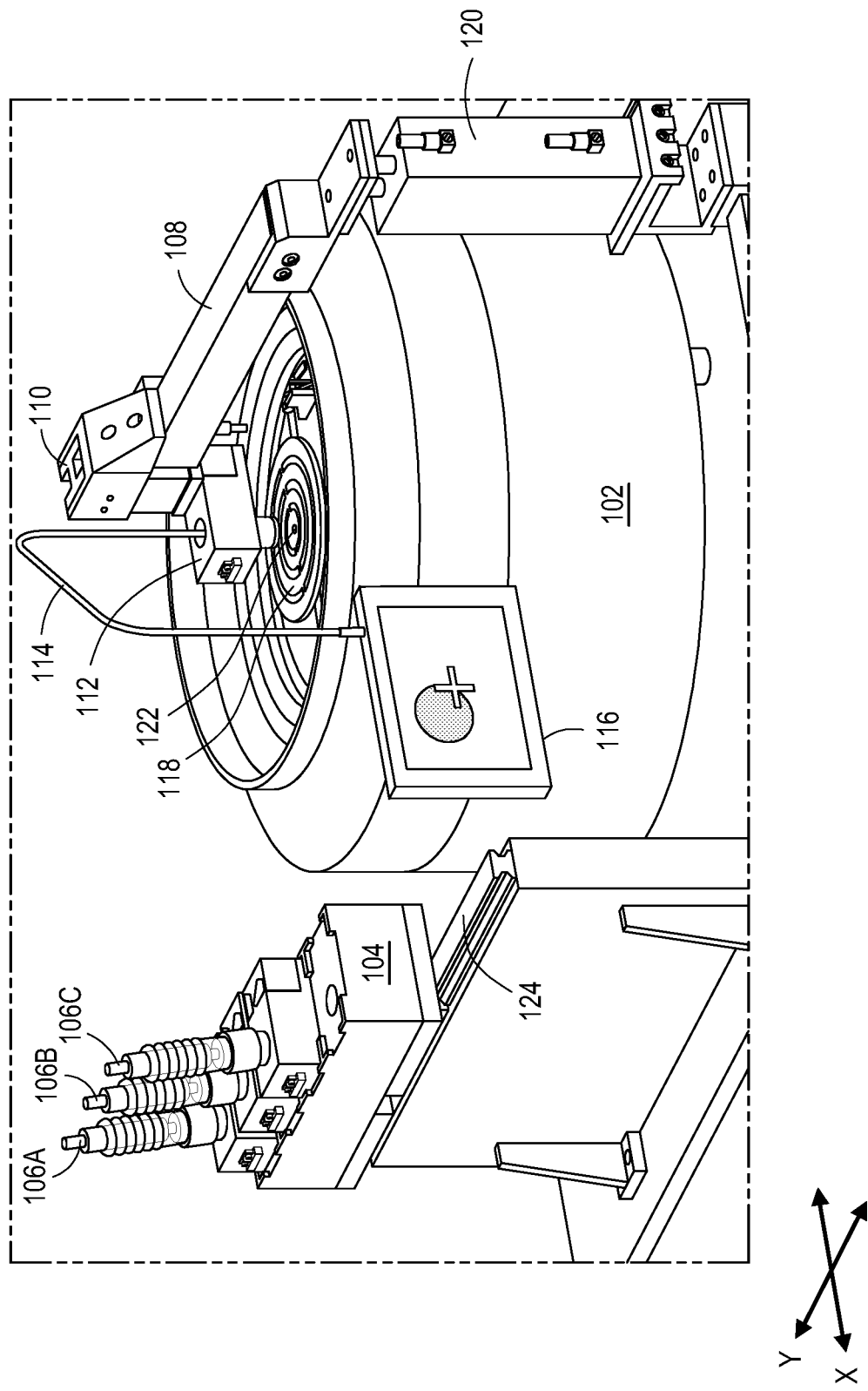
FIGS. 8A-8C illustrate the coater photoresist arm centering operation in accordance with the method set forth in FIG. 7.
Figure 8B:
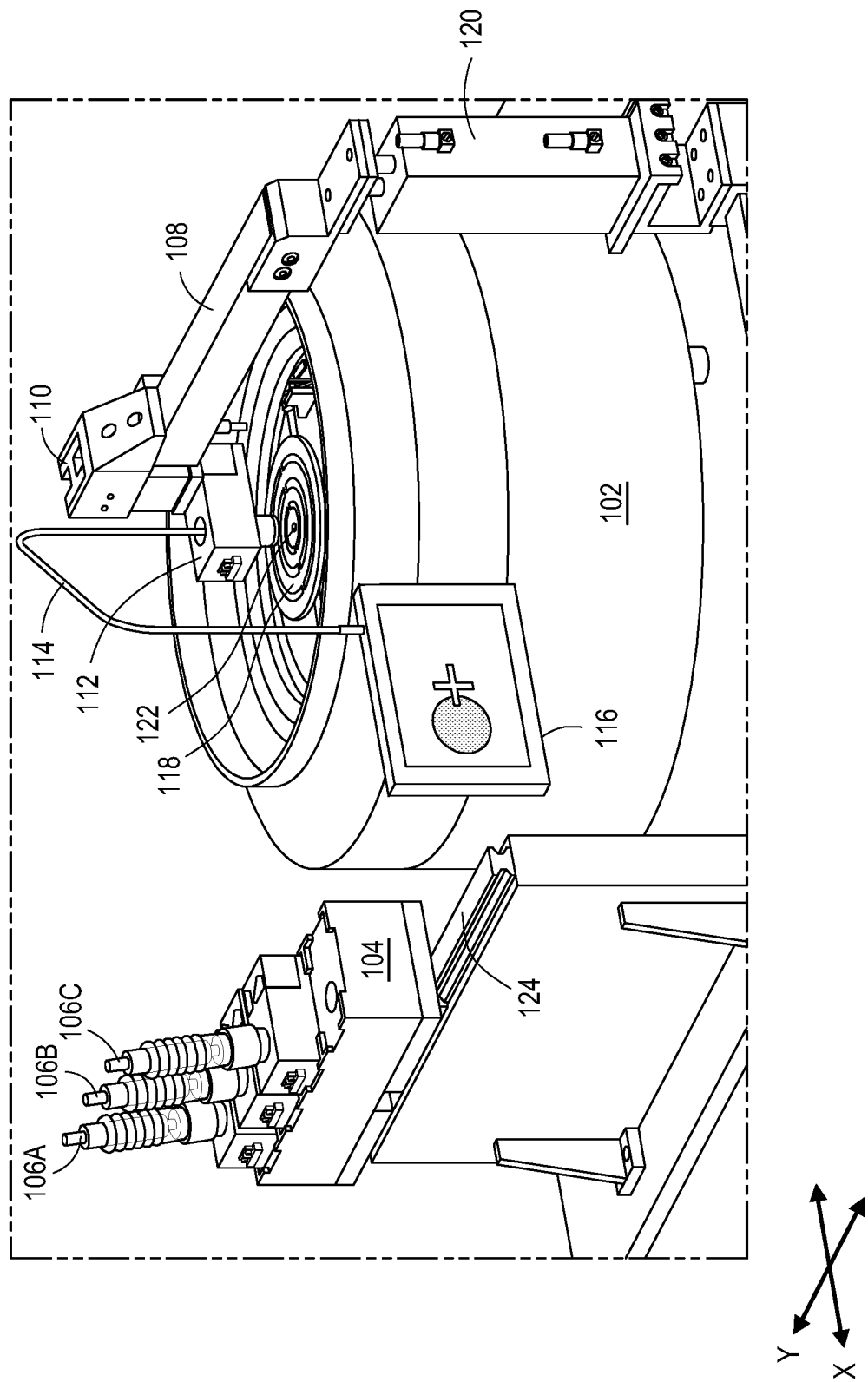
Figure 8C:
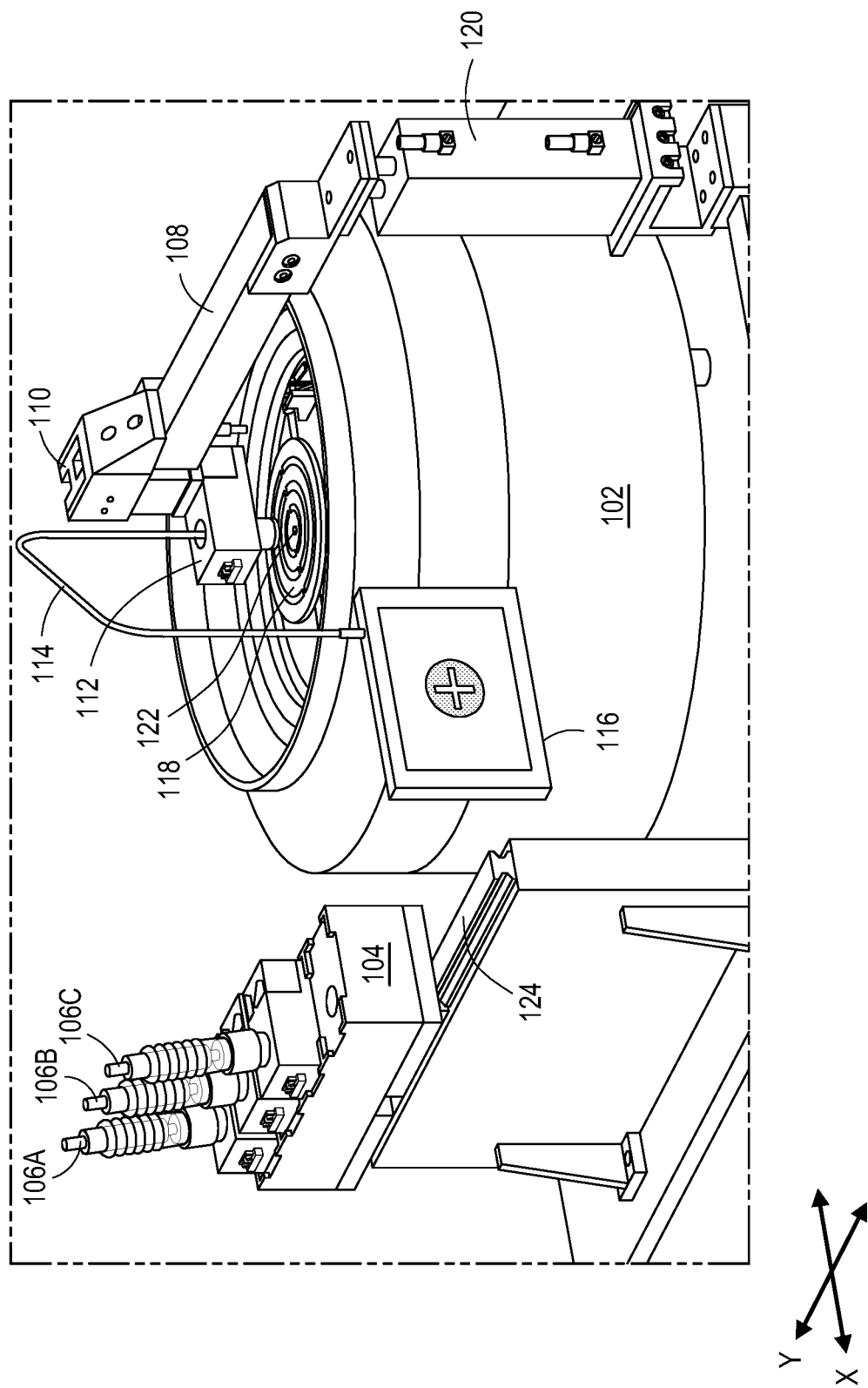

The preceding methodology of FIG. 7 will be better understood in conjunction with FIGS. 8A, 8B, and 8C, which provide an illustration of alignment operations of the coater arm 108 utilizing the alignment nozzle jig 112 in accordance with one embodiment of the subject application. As shown in FIG. 8A, the alignment nozzle jig 112 has been secured in the nozzle holder block lock cylinder 110 of the coater arm 108 and positioned near the center (vacuum hole 122) of the chuck 118 in the process chamber 102. The view screen 116 coupled to the endoscope 114 depicts the alignment mark 504 relative to the vacuum hole 122, i.e., the center of the chuck 118. As illustrated in FIG. 8A, the coater arm 108 appears to be misaligned in both the X axis position and the Y axis position. FIG. 8B illustrates a post Y axis modification, wherein as shown on the view screen 116, the alignment mark 504 relative to the vacuum hole 122 is aligned along the Y axis, but remains misaligned on the X axis. FIG. 8C illustrates post Y axis adjustment and post X axis adjustment, wherein the view screen 116 depicts the alignment mark 504 centered on the vacuum hole 122, i.e., the coater arm 108 is centered over the chuck 118. Thereafter, the alignment nozzle jig 112 is returned to the nozzle bath 104 by the coater arm 108. The coater arm 108 then moves to provide access to the nozzle bath 104, whereupon the alignment nozzle jig 112 is removed and replaced with a PR nozzle assembly 106A-D. The coater arm 108 may then proceed to retrieve one of the PR nozzle assemblies 106A-D for photoresist application within the process chamber 102.

Figure 9:
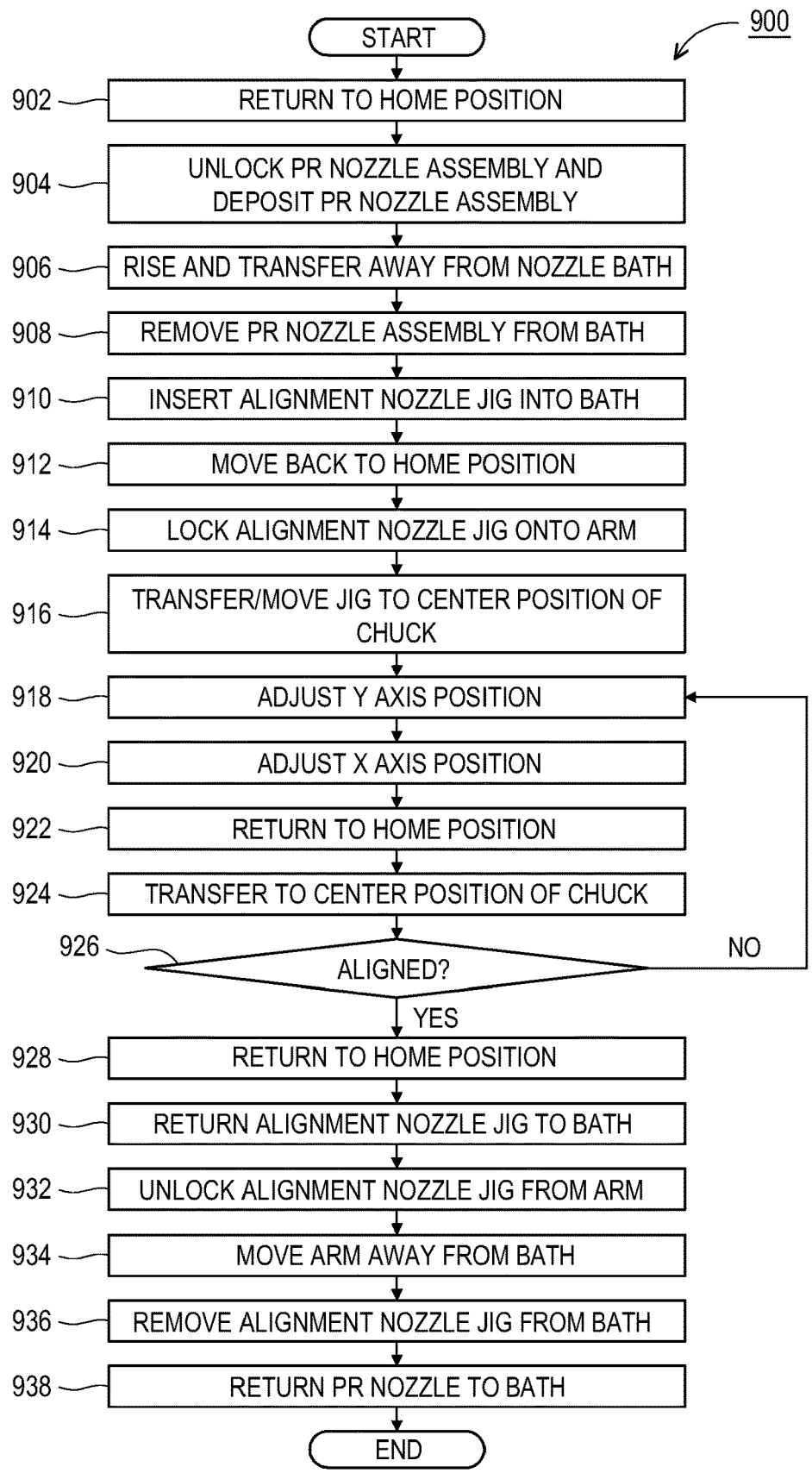
FIG. 9 is a flowchart illustrating a method for coater photoresist arm centering in accordance with one embodiment of the subject application.
Figure 10A:
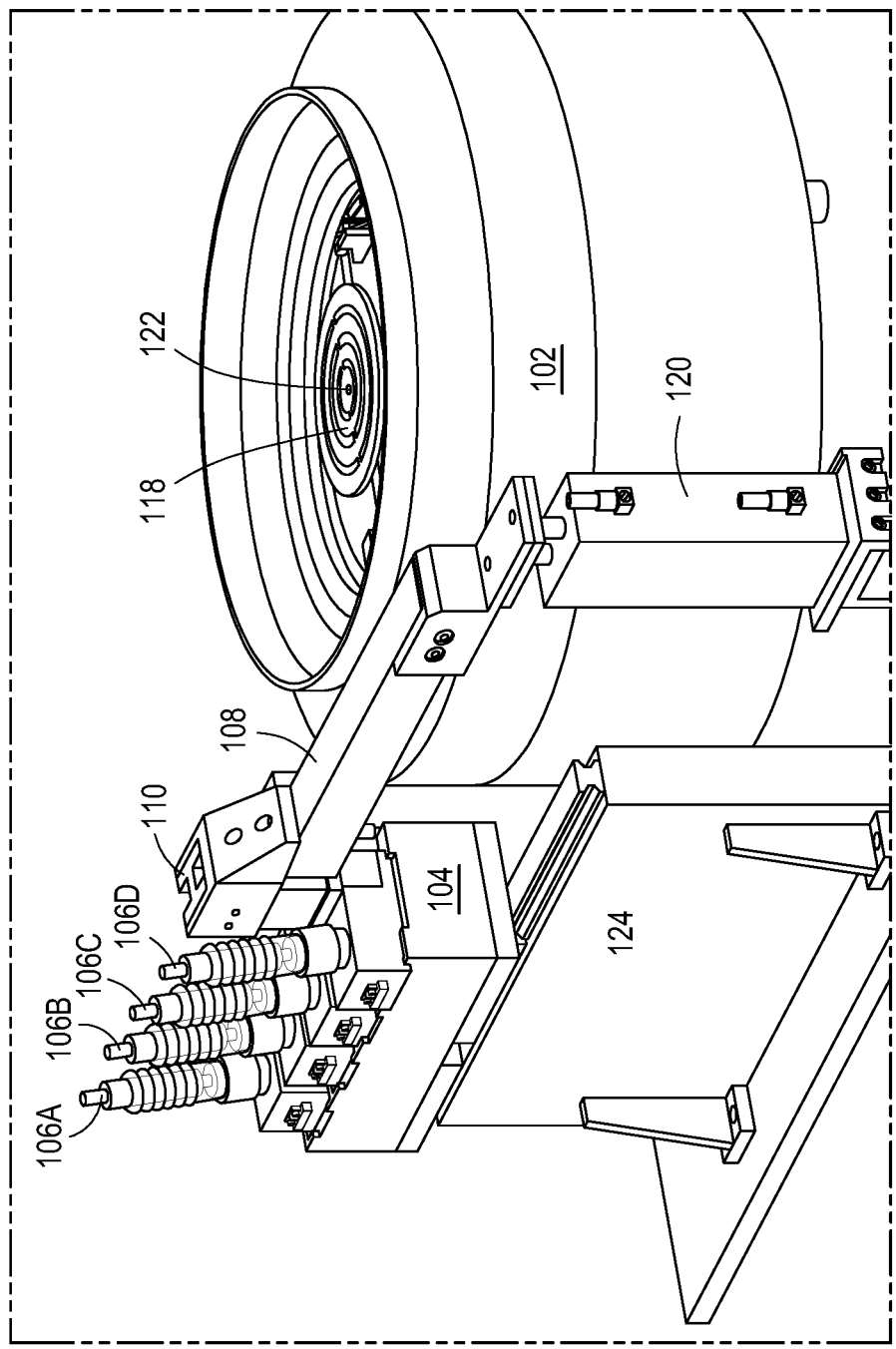
FIGS. 10A-10L illustrate the methodology set forth in the flowchart of FIG. 9 in accordance with one example embodiment of the subject application.
Figure 10B:
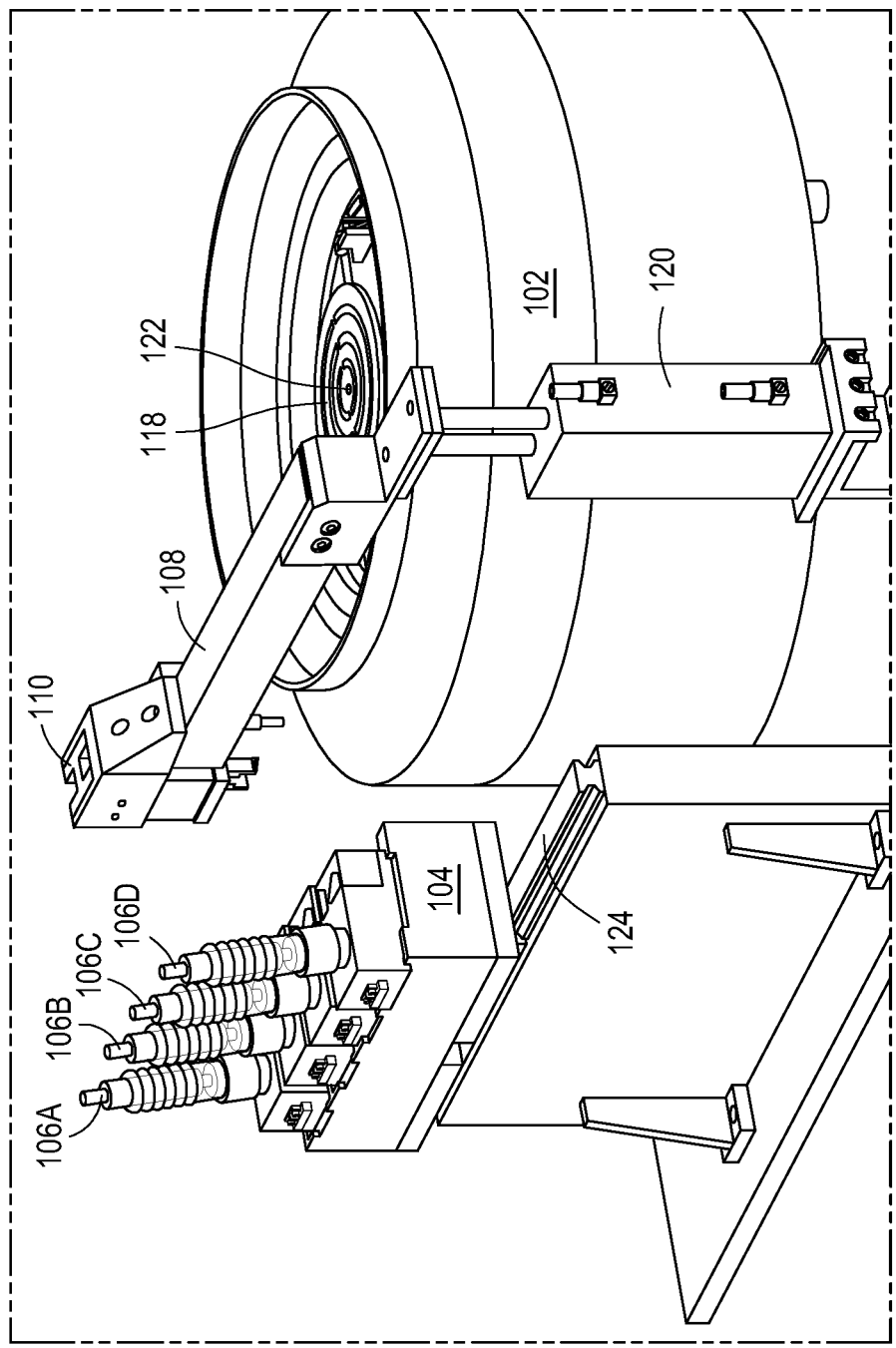
Figure 10C:
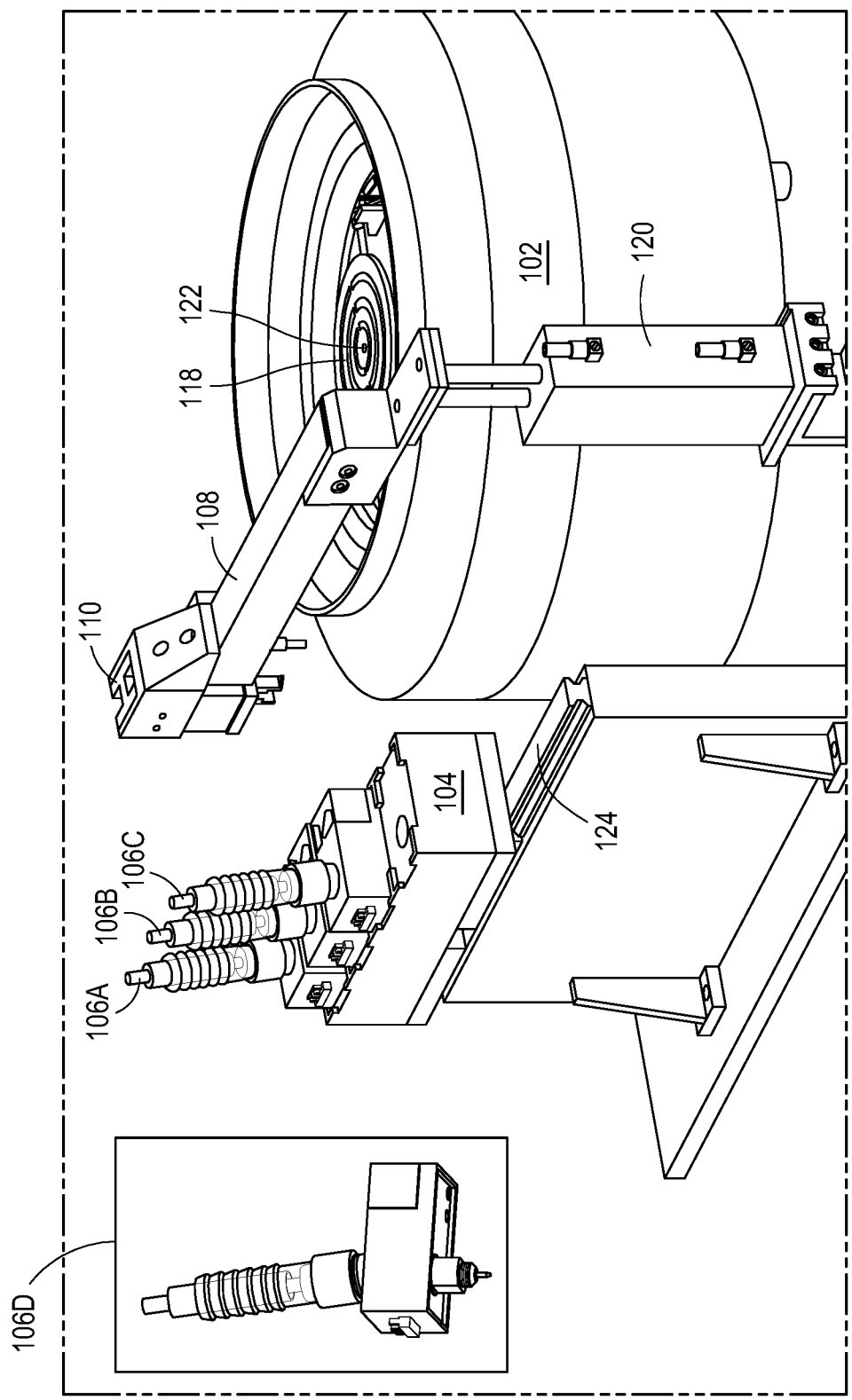
Figure 10D:
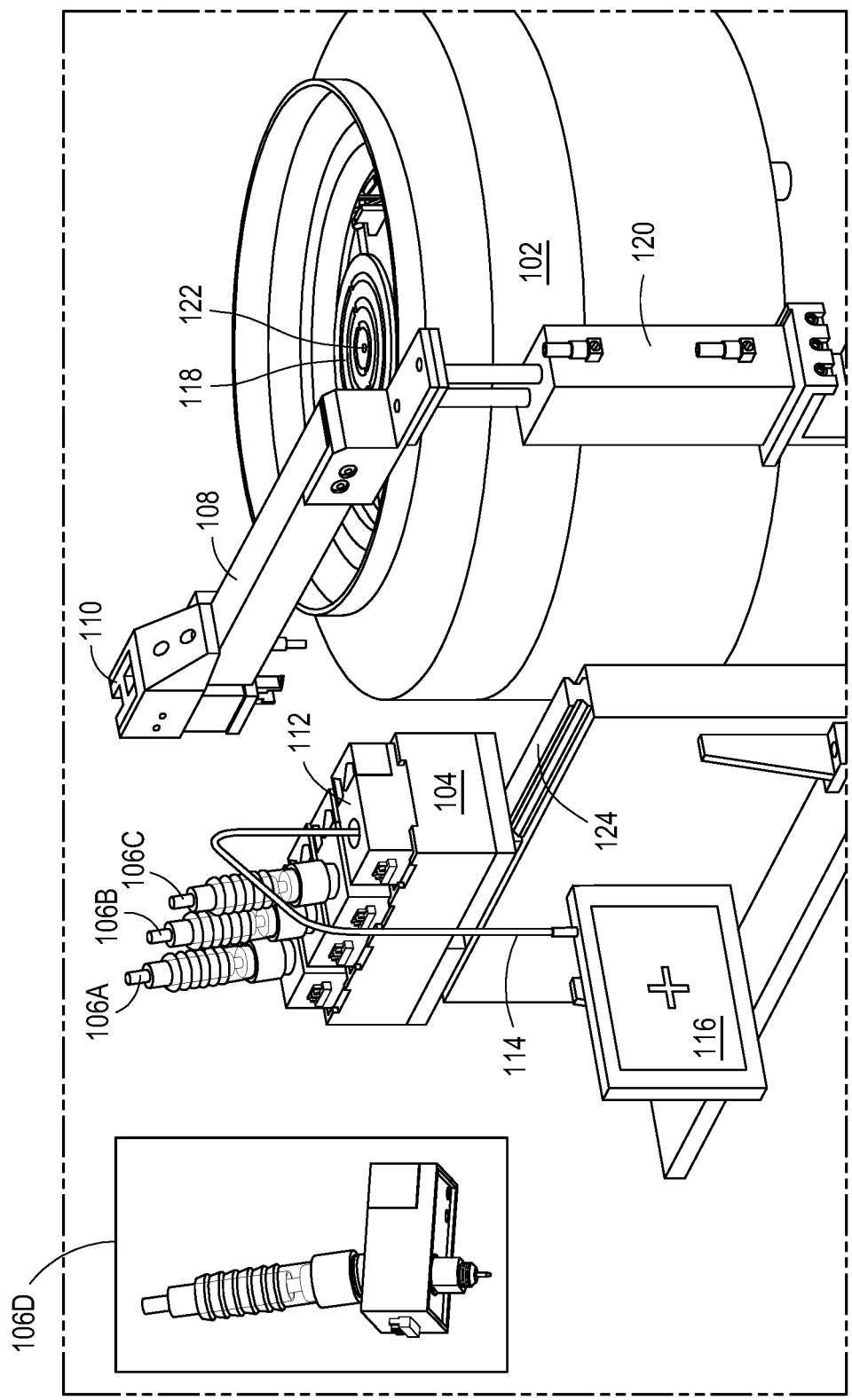

Turning now to FIG. 9, with reference to FIGS. 10A-10L, there is shown another method for coater arm alignment in accordance with one embodiment of the subject application. The method 900 illustrated in FIG. 9 begins at 902, whereupon the coater arm 108 retaining PR 4 nozzle assembly 106D in the nozzle holder block lock cylinder 110 returns to the home position of the PR 4 nozzle assembly 106D at the nozzle bath 104, as shown in FIG. 10A. At 904, the nozzle holder block lock cylinder 110 unlocks the PR 4 nozzle assembly 106D and deposits the PR 4 nozzle assembly 106D into the open position in the nozzle bath 104. The coater arm 108 then rises via the up/down cylinder 120 and moves away from the nozzle bath 104 at 906, as illustrated in FIG. 10B. At 908, the PR 4 nozzle assembly 106D is removed from the nozzle bath 104, as shown in FIG. 10C by a user or other device (not shown). The alignment nozzle jig 112 is then inserted into the nozzle bath 104 at the empty position at 910, i.e., replacing the PR 4 nozzle assembly 106D in the nozzle bath 104, as shown in FIG. 10D.

Figure 10E:
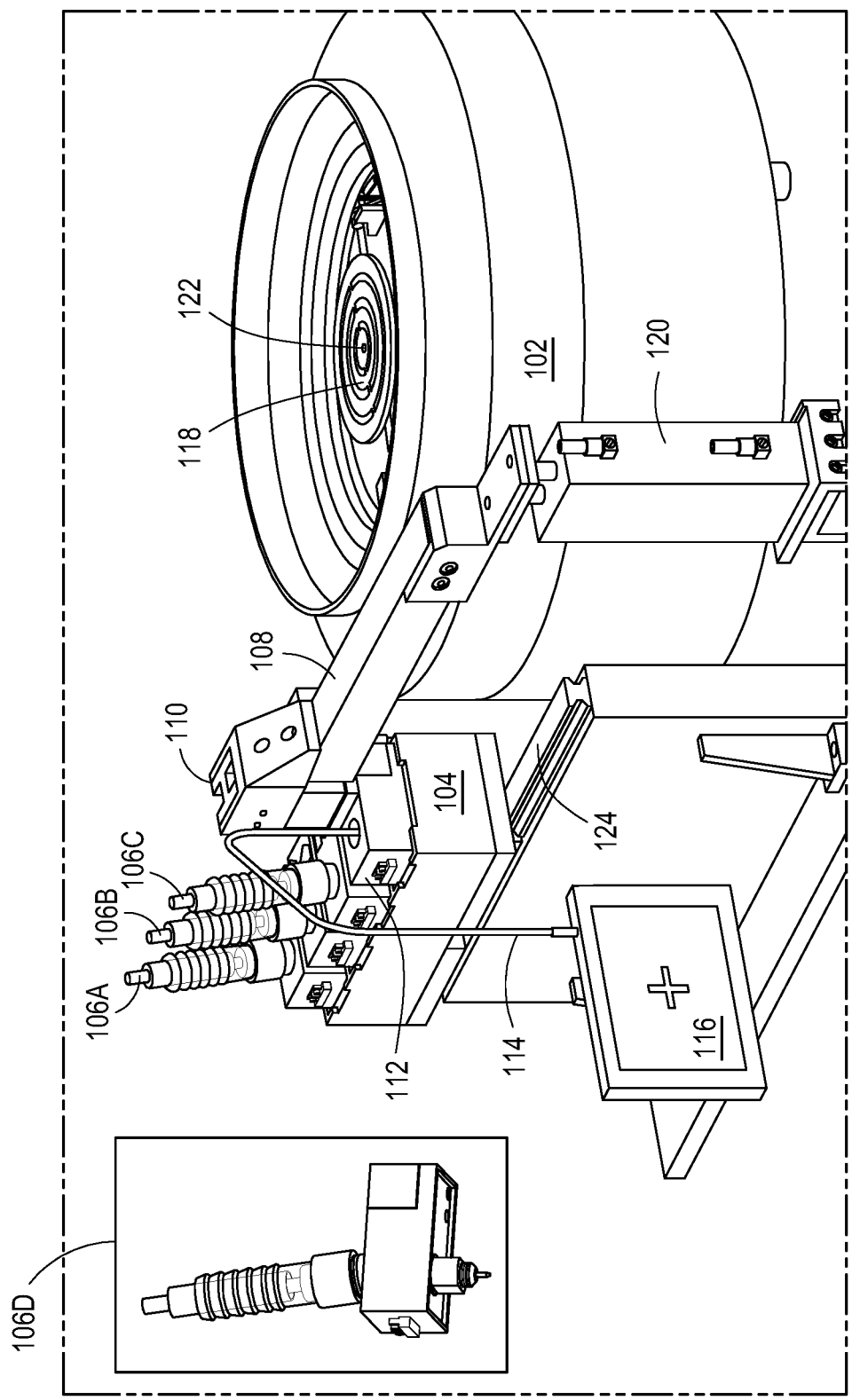
Figure 10F:
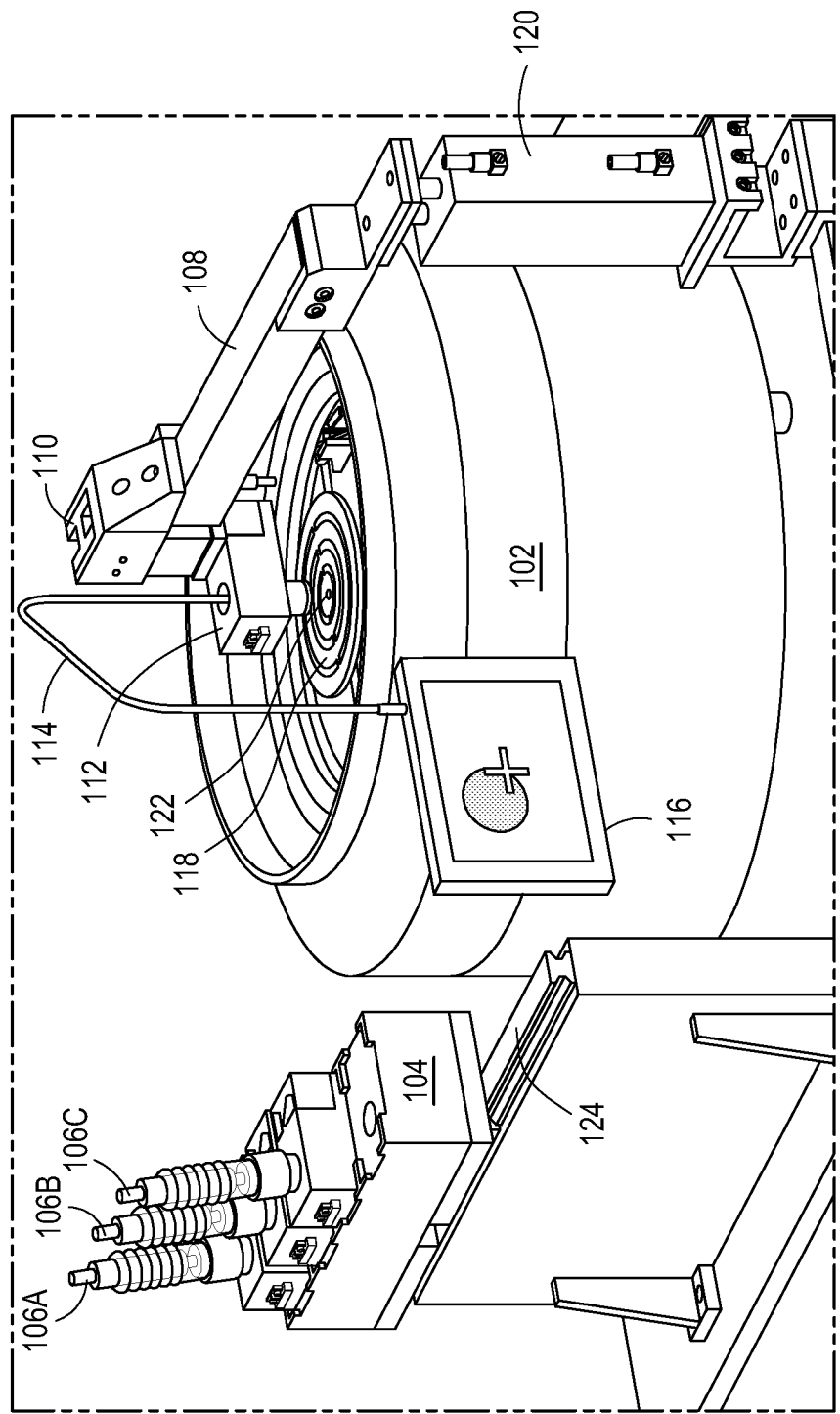

At 912, the coater arm 108 moves back to the home position above the alignment nozzle jig 112 in the nozzle bath 104, as shown in FIG. 10E. At 914, the coater arm 108 moves down via the up/down cylinder 120 to enable the nozzle holder block lock cylinder 110 to engage, i.e., lock the alignment nozzle jig 112 to the coater arm 108. At 916, the coater arm transfers to the center position of the chuck 118 in the process chamber 102, as illustrated in FIG. 10F. Here, the relative position of the alignment mark 504 and the vacuum hole 122 (circle depicted on the view screen 116) are checked via a technician, automatically, or a combination thereof. FIG. 10F illustrates that the alignment mark 504 and the vacuum hole 122 are not aligned for example purposes, i.e., misalignment has occurred in both the X axis position and the Y axis position.

Figure 10G:
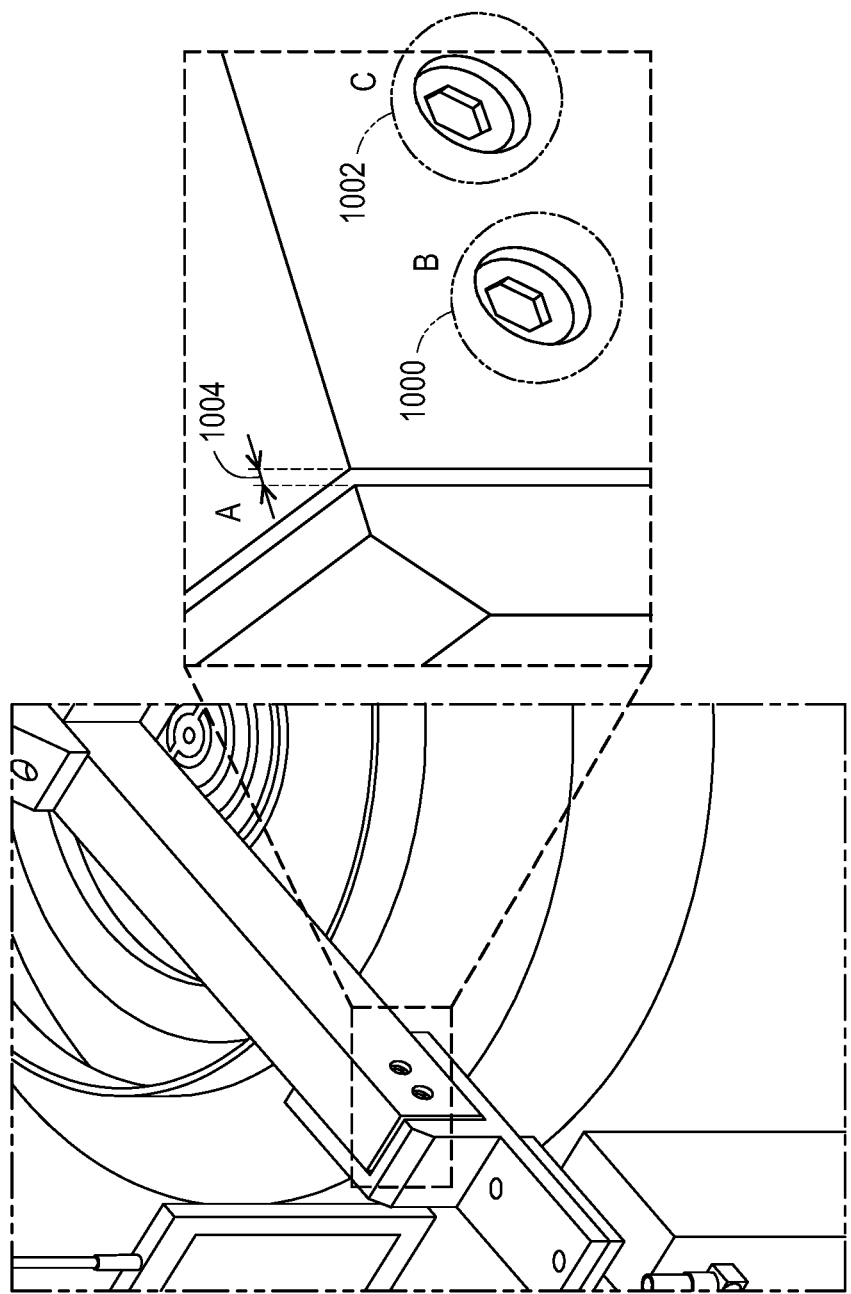
Figure 10H:
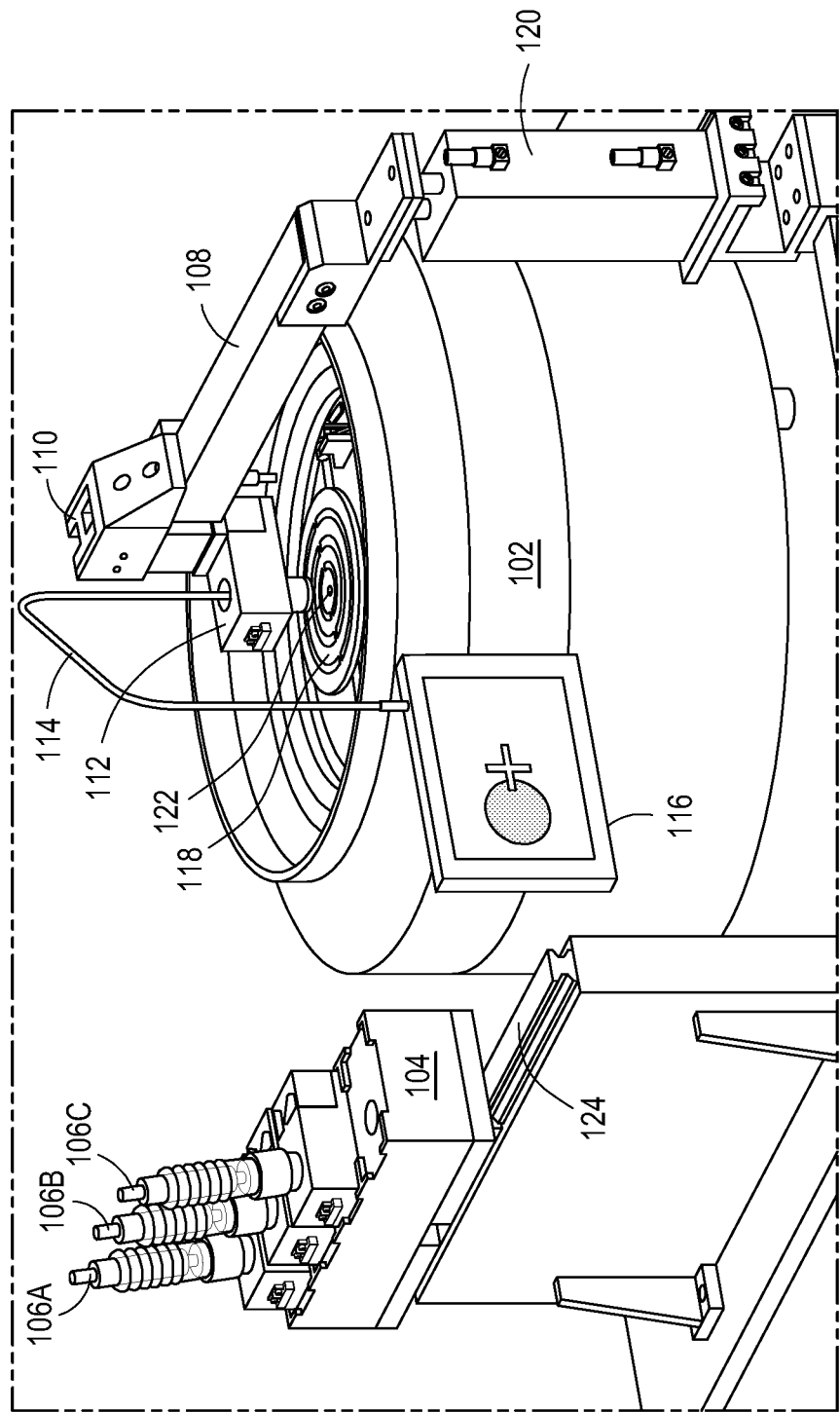

At 918, with reference to FIG. 10G, adjustment of the Y axis position commences via loosening of retention screws (B) 1000 and (C) 1002. The Y axis position is then adjusted to center via use of the view screen 116 depicting the alignment mark 504 and vacuum hole 122. Gap A 1004, shown in FIG. 10G illustrates the tolerance for the Y axis position. Once the Y axis position has been adjusted, retention screws (B) 1000 and (C) 1002 are tightened, and operations proceed to 920. At 920, as shown in FIG. 10H, the coater arm 108 offset position, i.e., the X axis position, is adjusted. In some embodiments, the X axis adjustment is made via slight movement of the motor (e.g., motor pulses) that moves the coater arm 108 and up/down cylinder 120 back and forth between the nozzle bath 104 and the process chamber 102. In accordance with one embodiment, the adjustment of the Y axis position and the X axis position is performed by an equipment engineer or other user manually. Alternatively, a combination of automatic and user manipulation may be used for adjustment and alignment.

Figure 10I:
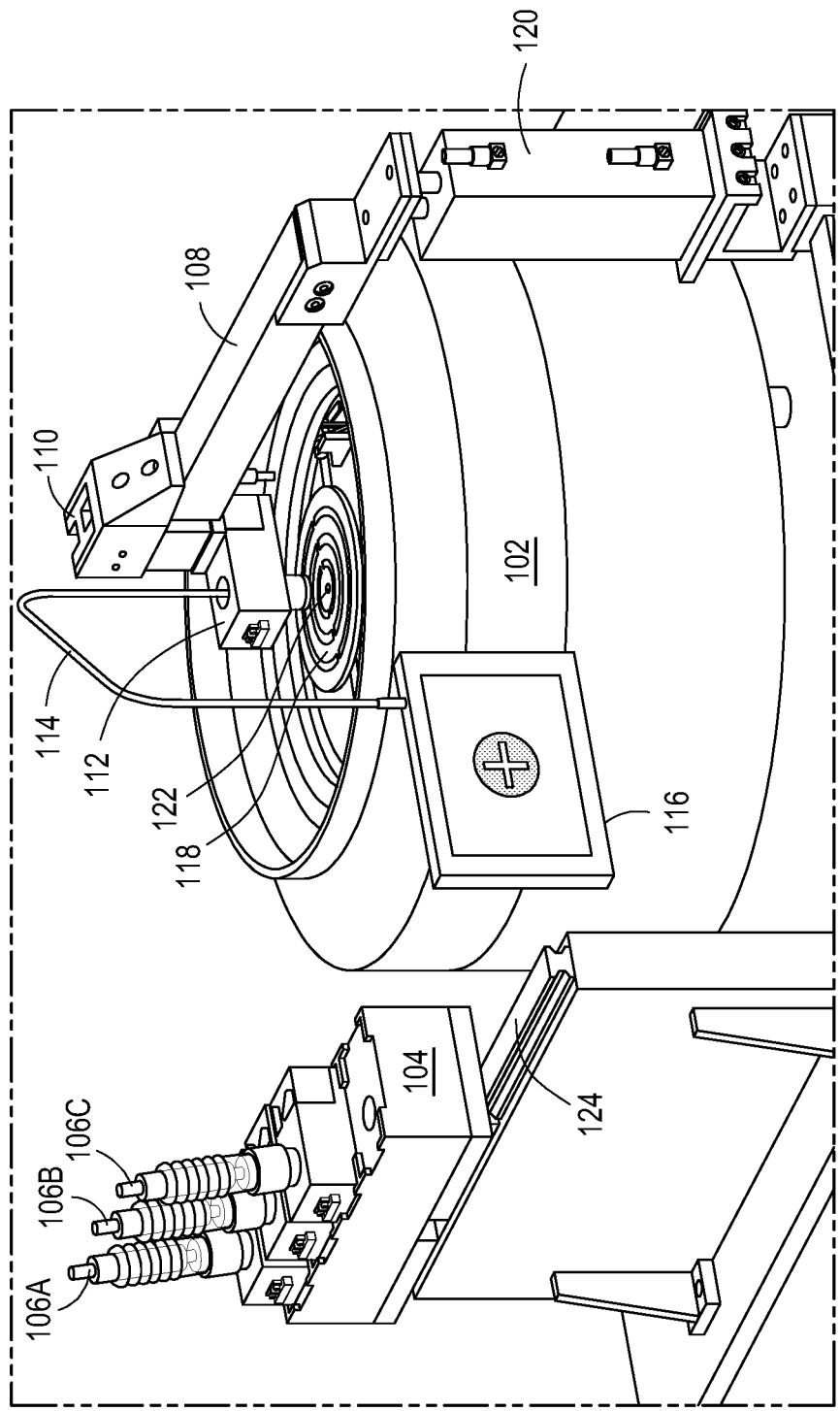

Upon completion of both Y axis position adjustment and X axis position adjustment, as verified by the alignment mark 504 within the vacuum hole 122 displayed on the view screen 116, the coater arm 108 returns to the home position above the nozzle bath 104 at 922. The coater arm 108 then moves, at 924, back to the center position (i.e., centered on the chuck 118) above the process chamber 102, whereupon a determination is made whether the relative position of the alignment mark 504 and the vacuum hole 122 are correct at 926, as illustrated in FIG. 10I. Upon a negative determination, operations return to 918 for adjustment of the Y axis position and/or the X axis position. Operations then proceed thereafter as discussed above.

Figure 10J:
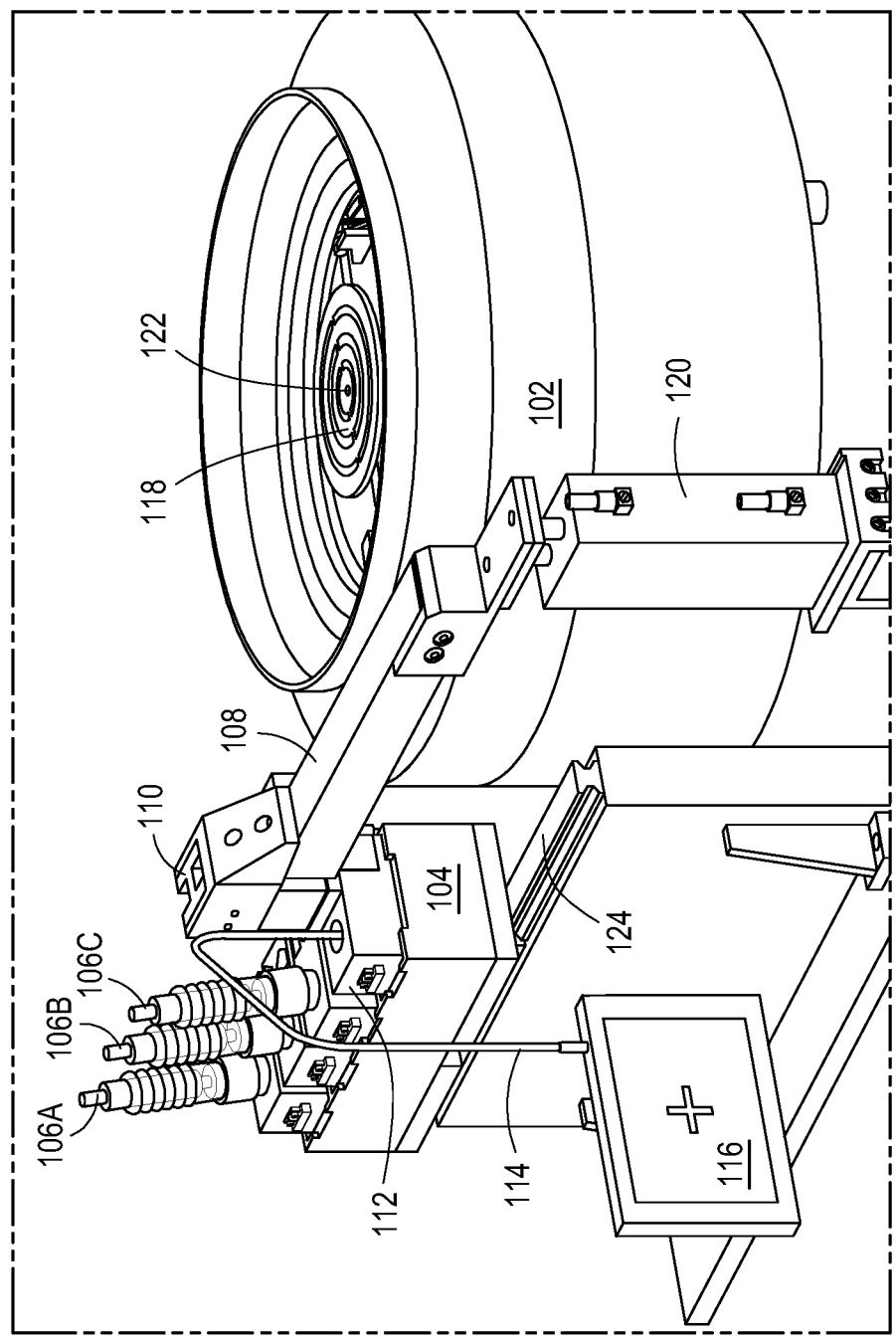
Figure 10K:
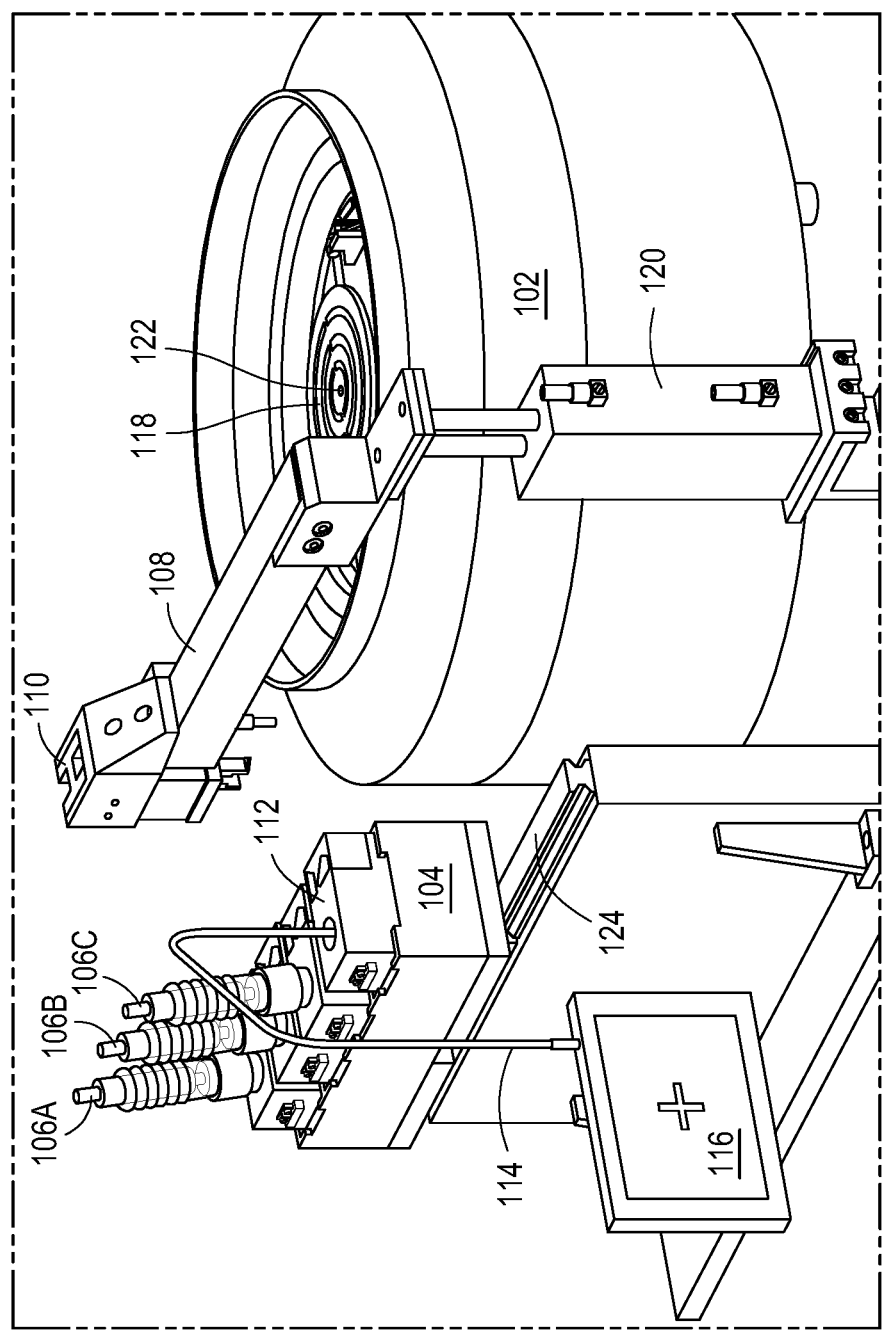
Figure 10L:
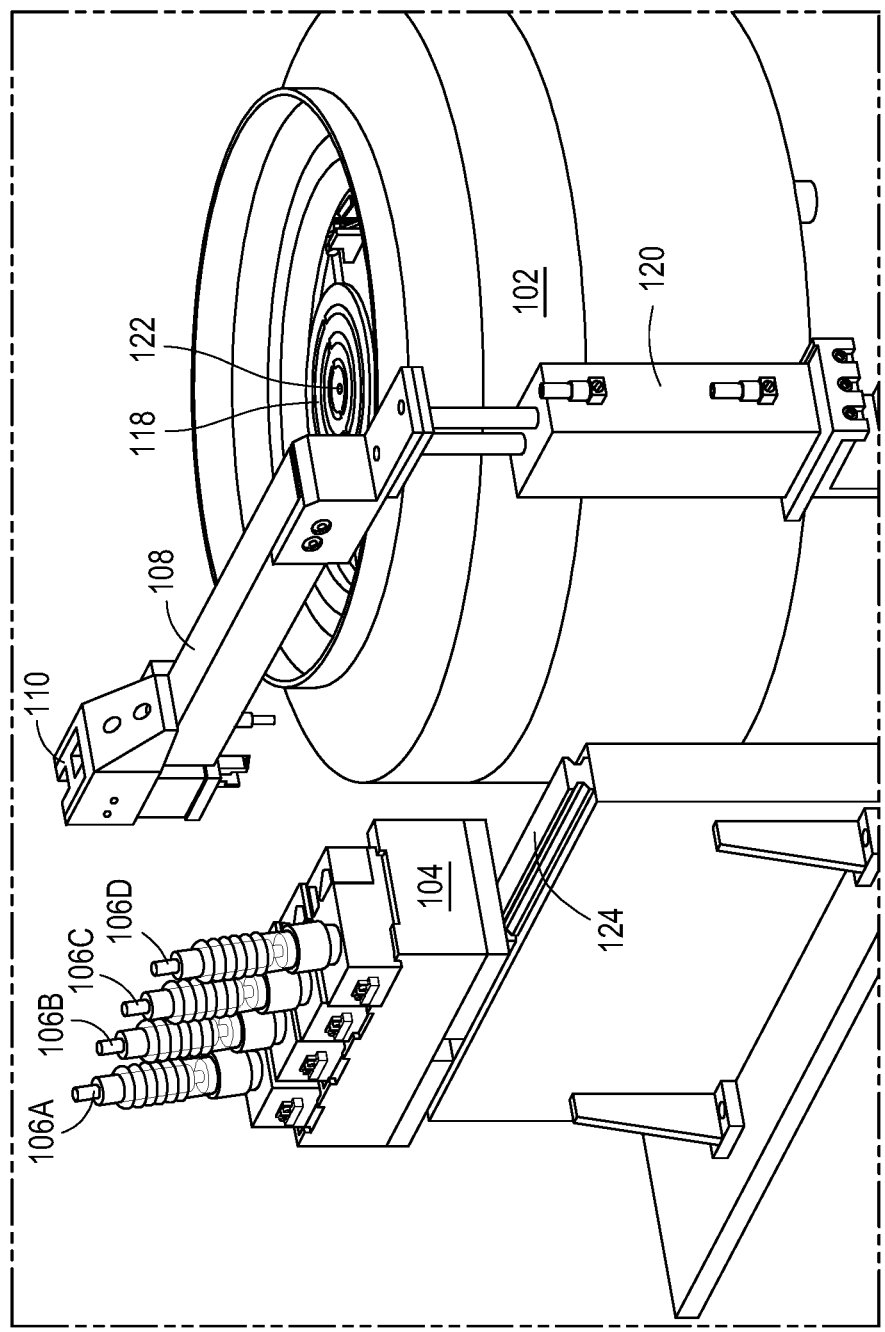

Upon a positive determination at 926, the coater arm 108 with the alignment nozzle jig 112 returns to the home position at 928, as shown in FIG. 10J. The coater arm 108, via the up/down cylinder 120, then returns the alignment nozzle jig 112 to the correct position on the nozzle bath 104 at 930. The nozzle holder block lock cylinder 110 then unlocks the alignment nozzle jig 112 at 932. At 934, the coater arm 108 moves to allow access to the nozzle bath 104, as shown in FIG. 10K. The alignment nozzle jig 112 is then removed from the nozzle bath 104 at 936, and the PR 4 nozzle assembly 106D is returned to the nozzle bath 104 at 938, as illustrated in FIG. 10L. Thereafter, the coater arm 108, via the nozzle holder block lock cylinder 110 may retrieve any of PR nozzle assemblies 106A-D to perform photoresist operations in the process chamber 102. It will be appreciated that the coater arm 108, via the method set forth above, is now centered over the chuck 118, and as such, the nozzle tip 402 of any of the PR nozzle assemblies 106A-D is likewise centered, enabling efficient depositing of photoresist on an associated wafer.

It will be appreciated by those skilled in the art that the use of the alignment nozzle jig 112 reduces the amount of time spent by an equipment engineer to adjust the nozzle tip 402 of a PR nozzle assembly 106A-D. Further, as the endoscope 114 quickly and accurately confirms that the nozzle tip 402 is centered, a reduction in wafer center poor coating defects occurs. Further, the accuracy of the nozzle tip centering is improved via use of the alignment nozzle jig 112.

In accordance with one embodiment, there is provided a method for coater photoresist arm centering. The method includes retrieving, from a nozzle bath, an alignment nozzle jig having an endoscope coupled thereto. The method further includes moving, via the coater photoresist arm with the alignment nozzle jig to a center of a chuck of an associated process chamber. In addition, the method comprises aligning, via the endoscope, the coater photoresist arm with the center of the chuck.

In accordance with another embodiment, there is provided an alignment nozzle jig that includes an alignment nozzle block. The alignment nozzle jig also includes an endoscope holder removably secured to a bottom of the alignment nozzle block. Additionally, the alignment nozzle jig includes an alignment mark removably coupled to the endoscope holder opposite the alignment nozzle block.

In accordance with still another embodiment, there is provided a system for coater photoresist arm centering. The system includes an alignment nozzle jig for centering of the coater photoresist arm. The system also includes a nozzle bath configured to store at least one photoresist nozzle assembly and the alignment nozzle jig. The system further includes an endoscope removably coupled to the alignment nozzle jig, and a view screen in communication with the endoscope. The system further includes a nozzle holder block lock cylinder disposed on one end of the coater photoresist arm. In the system, the alignment nozzle jig or the at least one photoresist nozzle assembly is secured by the nozzle holder block lock cylinder.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for coater photoresist arm centering, comprising:
retrieving, from a nozzle bath, an alignment nozzle jig having an endoscope coupled thereto;
moving the alignment nozzle jig toward a chuck of an associated process chamber via the coater photoresist arm; and
aligning the coater photoresist arm with a center of the chuck using the endoscope.

2. The method of claim 1, wherein the alignment nozzle jig comprises an endoscope holder configured to hold the endoscope and an alignment mark affixed to the endoscope holder.

3. The method of claim 2, wherein the chuck further comprises a vacuum hole positioned at the center of the chuck.

4. The method of claim 3, wherein aligning the coater photoresist arm further comprises generating, via a view screen in communication with the endoscope, an image of the alignment mark relative to the vacuum hole.

5. The method of claim 4, further comprising adjusting the coater photoresist arm in at least one of an X axis position or a Y axis position.

6. The method of claim 5, wherein adjusting in the X axis position further comprises moving, via an associated motor, the coater photoresist arm.

7. The method of claim 2, further comprising transferring the coating photoresist arm to a home position relative to the nozzle bath, wherein the retrieving is performed at the home position.

8. The method of claim 1, further comprising:
removing, from the nozzle bath, at least one photoresist nozzle assembly; and
replacing the removed at least one photoresist nozzle assembly with the alignment nozzle jig.

9. The method of claim 1, wherein the step of retrieving further comprises securing the alignment nozzle jig in a nozzle holder block lock cylinder of the coater photoresist arm.

10. A method for coater photoresist arm centering, comprising:
retrieving, from a nozzle bath, an alignment nozzle jig comprising an alignment nozzle block, an endoscope holder removably secured to a bottom of the alignment nozzle block, and an alignment mark removably coupled to the endoscope holder opposite the alignment nozzle block;

moving the alignment nozzle jig toward a chuck of an associated process chamber via the coater photoresist arm; and aligning the coater photoresist arm with a vacuum hole positioned at a center of the chuck using the endoscope.

11. The method of claim 10, wherein aligning the coater photoresist arm further comprises generating, via a view screen in communication with the endoscope, an image of the alignment mark relative to the vacuum hole.

12. The method of claim 11, further comprising adjusting the coater photoresist arm in at least one of an X axis position or a Y axis position, wherein adjusting in the X axis position further comprises moving, via an associated motor, the coater photoresist arm.

13. The method of claim 12, further comprising adjusting the coater photoresist arm in at least one of an X axis position or a Y axis position, wherein adjusting in the X axis position further comprises moving, via an associated motor, the coater photoresist arm.

14. The method of claim 10, further comprising transferring the coating photoresist arm to a home position relative to the nozzle bath, wherein the retrieving is performed at the home position.

15. The method of claim 10, further comprising:

removing, from the nozzle bath, at least one photoresist nozzle assembly; and replacing the removed at least one photoresist nozzle assembly with the alignment nozzle jig.

16. The method of claim 10, wherein the step of retrieving further comprises securing the alignment nozzle jig in a nozzle holder block lock cylinder of the coater photoresist arm.

17. The method of claim 10, further comprising:

transferring the coating photoresist arm to a home position relative to the nozzle bath;

removing, from the nozzle bath, at least one photoresist nozzle assembly; and replacing the removed at least one photoresist nozzle assembly with the alignment nozzle jig, wherein the retrieving is performed at the home position.

18. A method for coater photoresist arm centering, comprising:

retrieving, from a nozzle bath, an alignment nozzle jig having an endoscope coupled thereto;

securing the alignment nozzle jig in a nozzle holder block lock cylinder disposed on one end of the coater photoresist arm;

moving the alignment nozzle jig toward a chuck of an associated process chamber via the coater photoresist arm; and aligning the coater photoresist arm with a vacuum hole positioned at a center of the chuck using the endoscope.

19. The method of claim 18, wherein aligning the coater photoresist arm further comprises generating, via a view screen in communication with the endoscope, an image of the alignment mark relative to the vacuum hole.

20. The method of claim 18, wherein the nozzle bath stores a plurality of nozzle assemblies.

* * * * *